US010972684B1

(12) United States Patent
Bardagjy et al.

(10) Patent No.: US 10,972,684 B1
(45) Date of Patent: Apr. 6, 2021

(54) SPARSE LOCK-IN PIXELS FOR HIGH AMBIENT CONTROLLER TRACKING

(71) Applicant: Facebook Technologies, LLC, Menlo Park, CA (US)

(72) Inventors: Andrew Matthew Bardagjy, Seattle, WA (US); Manoj Bikumandla, Union City, CA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/542,104

(22) Filed: Aug. 15, 2019

(51) Int. Cl.
*G06F 3/03* (2006.01)
*H04N 5/33* (2006.01)
*H01L 27/146* (2006.01)
*G02B 27/01* (2006.01)

(52) U.S. Cl.
CPC .......... *H04N 5/33* (2013.01); *G02B 27/0172* (2013.01); *G06F 3/0304* (2013.01); *H01L 27/14612* (2013.01); *H01L 27/14649* (2013.01); *G02B 2027/0138* (2013.01); *G02B 2027/0178* (2013.01); *H01L 27/1462* (2013.01); *H01L 27/1464* (2013.01); *H01L 27/14621* (2013.01); *H01L 27/14627* (2013.01)

(58) Field of Classification Search
CPC .................. H04N 5/33; G02B 27/0172; G02B 2027/0138; G02B 2027/0178; G06F 3/0304; H01L 27/14612; H01L 27/14649; H01L 27/1462; H01L 27/14621; H01L 27/14627; H01L 27/1464
See application file for complete search history.

(56) References Cited

U.S. PATENT DOCUMENTS

| | | | |
|---|---|---|---|
| 2011/0187908 A1* | 8/2011 | Kawahito | H01L 27/14603 348/306 |
| 2011/0260059 A1* | 10/2011 | Jiang | H01L 27/14647 250/330 |
| 2020/0235151 A1* | 7/2020 | Suzuki | H01L 27/14614 |

* cited by examiner

*Primary Examiner* — Lisa S Landis
(74) *Attorney, Agent, or Firm* — Weaver Austin Villeneuve & Sampson LLP

(57) ABSTRACT

An image sensor includes a two-dimensional array of active pixels, where each active pixel in the two-dimensional array of active pixels includes a respective photodiode. The image sensor also includes a plurality of lock-in pixels at two or more regions of the two-dimensional array. Each of the plurality of lock-in pixels includes two pixel elements that share a common photodiode. Each pixel element of the two pixel elements in a lock-in pixel includes a charge storage node and a switch configured to receive a respective control signal to selectively connect the respective charge storage node to the common photodiode.

20 Claims, 13 Drawing Sheets

SPARSE LOCK-IN PIXELS FOR HIGH AMBIENT CONTROLLER TRACKING

BACKGROUND

An artificial reality system, such as a head-mounted display (HMD) or heads-up display (HUD) system, generally includes a near-eye display system in the form of a headset or a pair of glasses and configured to present content to a user via an electronic or optic display within, for example, about 10-20 mm in front of the user's eyes. The near-eye display system may display virtual objects or combine images of real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). To provide a more immersive artificial reality experience, some artificial reality systems may include an input device for receiving user inputs, such as hand and/or finger movements. The artificial reality systems may then use the information gained from the input device to modify or generate images of virtual objects, thereby providing a more immersive experience for the user.

SUMMARY

This disclosure relates generally to artificial reality systems. More specifically, and without limitation, disclosed herein are techniques for tracking a controller in an artificial reality system, such as a virtual reality (VR) or an augmented reality (AR) system. According to certain embodiments, an image sensor for both visible light imaging (e.g., for simultaneous localization and mapping (SLAM)) and infrared light controller tracking in an artificial reality system may include a hybrid, dual-band, and dual-function image sensor that includes an active pixel array and a set of lock-in pixels distributed at certain regions of the active pixel array in the image sensor. The active pixel array and the set of lock-in pixels are sensitive to light in both the visible band and the infrared band. The active pixel array may be used to capture, for example, visible light images. The lock-in pixels may be used as lock-in detectors to detect infrared light pulses for controller tracking, even when the ambient light intensity is much higher than the intensity of the infrared light pulses, because the infrared light pulses can be distinguished from the DC ambient light due to their AC nature. Various inventive embodiments are described herein, including devices, systems, methods, materials, and the like.

According to some embodiments, an image sensor may include a two-dimensional array of active pixels, where each active pixel in the two-dimensional array of active pixels may include a respective photodiode. The image sensor may also include a plurality of lock-in pixels at two or more regions of the two-dimensional array. Each of the plurality of lock-in pixels may include two pixel elements that share a common photodiode. Each pixel element of the two pixel elements in a lock-in pixel may include a charge storage node and a switch configured to receive a respective control signal to selectively connect the charge storage node to the common photodiode.

In some embodiments, the common photodiode may be sensitive to both visible light and infrared light. The common photodiode may include, for example, a pinned photodiode. In some embodiments, the switch may include a metal-oxide-semiconductor field-effect transistor. In some embodiments, each pixel element of the two pixel elements may further include a reset gate connected to the charge storage node and configured to reset the charge storage node to a voltage level. In some embodiments, the charge storage node may include a floating diffusion node. In some embodiments, the image sensor may include a micro-lens on each respective lock-in pixel in the plurality of lock-in pixels.

In some embodiments, each active pixel of the two-dimensional array of active pixels may further include a storage node and a transfer gate between the respective photodiode and the storage node of the active pixel. The active pixel may include a five-transistor global shutter active pixel, a four-transistor active pixel, or a three-transistor active pixel.

According to certain embodiments, a system may include an image sensor and a portable device in the field of view of the image sensor. The image sensor may include a two-dimensional array of active pixels each including a respective photodiode that is sensitive to visible light, and a plurality of lock-in pixels at two or more regions of the two-dimensional array. Each lock-in pixel in the plurality of lock-in pixels may include two pixel elements. The two pixel elements may share a common photodiode that is sensitive to infrared light. Each of the two pixel elements may include a switch connected to the common photodiode. The portable device may include a light source that is configured to generate infrared light pulses at a first frequency. The switch in each of the two pixel elements in the lock-in pixel may be configurable to switch at the first frequency and with a different respective phase delay.

In some embodiments of the system, a difference between the respective phase delays for switching the two pixel elements in the lock-in pixel may be about 90°. The common photodiode may also be sensitive to the visible light, and may include a pinned photodiode. The switch may include a metal-oxide-semiconductor field-effect transistor. Each active pixel of the two-dimensional array of active pixels may include a five-transistor global shutter active pixel, a four-transistor active pixel, or a three-transistor active pixel. The two-dimensional array of active pixels may be configured to capture images in the visible light. The plurality of lock-in pixels may be configured to capture the infrared light pulses from the light source, and the system may include a processor configured to determine a location of the portable device based on the infrared light pulses captured by the plurality of lock-in pixels. In some embodiments, the system may include an artificial reality system, the image sensor may be in a head-mounted device or a console of the artificial reality system, and the portable device may include a controller of the artificial reality system.

According to certain embodiments, a method may include modulating an infrared light source on a portable device by a modulation signal having a first frequency, generating infrared light pulses by the infrared light source, and illuminating a photodiode of a lock-in pixel on an image sensor by the infrared light pulses. The lock-in pixel may also include a first transfer gate between the photodiode and a first charge storage node, and a second transfer gate between the photodiode and a second charge storage node. The method may also include switching the first transfer gate at the first frequency and a first phase to generate a first voltage signal at the first charge storage node, switching the second transfer gate at the first frequency and a second phase to generate a second voltage signal at the second charge storage node, determining that a difference between an amplitude of the first voltage signal and an amplitude of the second voltage signal is greater than a threshold value, and determining a position of the portable device based on a position of the lock-in pixel on the image sensor.

In some embodiments, the method may further include capturing, by a two-dimensional array of active pixels of the image sensor, a visible light image of a field of view of the image sensor. In some embodiments, the method may further include determining a phase of the infrared light pulses illuminating the photodiode based on the first voltage signal and the second voltage signal, and determining a distance between the image sensor and the infrared light source.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

Figure 1:
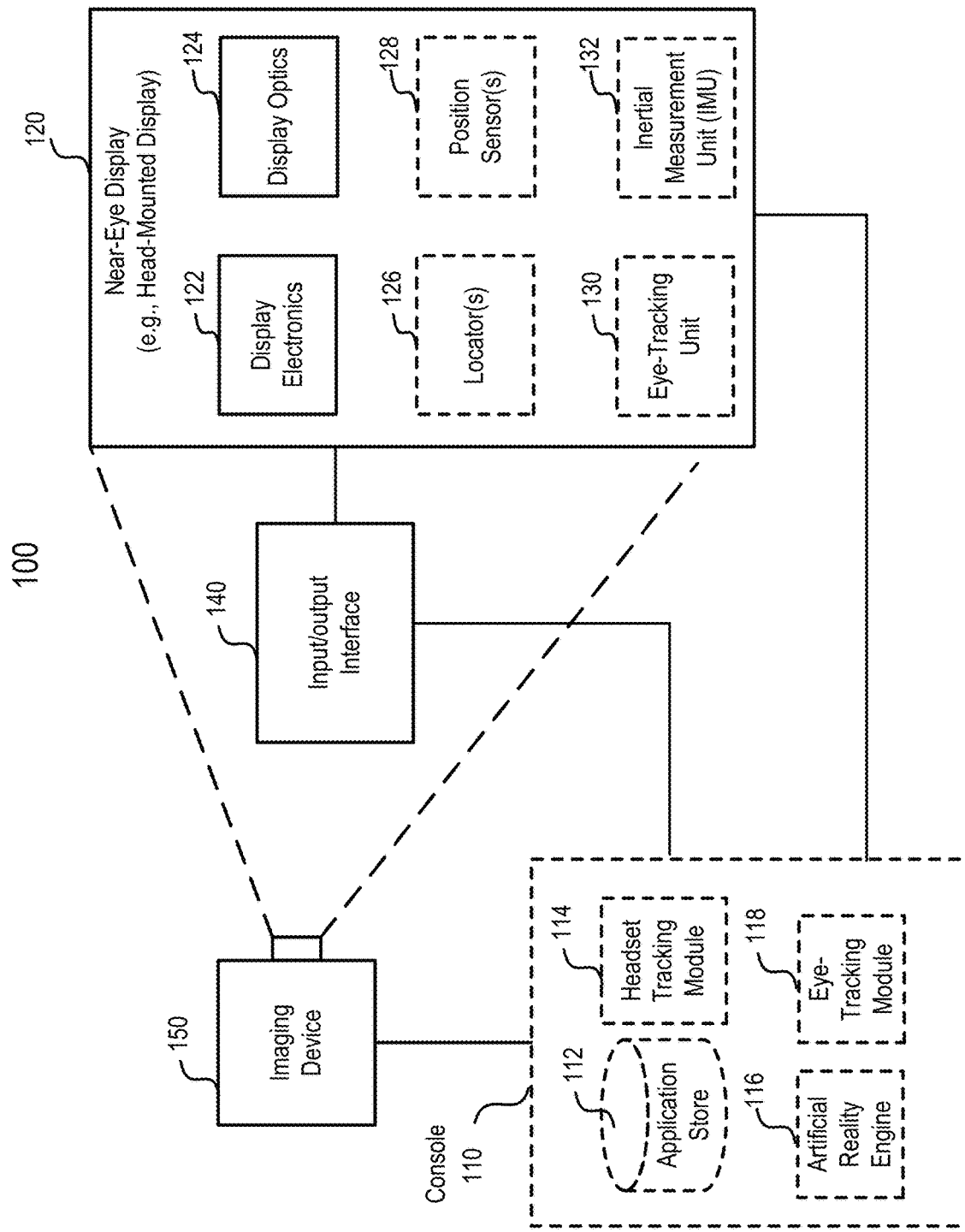
FIG. 1 is a simplified block diagram of an example of an artificial reality system including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to artificial reality systems. More specifically, and without limitation, disclosed herein are techniques for tracking a controller in an artificial reality system, such as a virtual reality (VR), augmented reality (AR), and mixed reality (MR) system. According to certain embodiments, an image sensor for both visible light imaging (e.g., for simultaneous localization and mapping (SLAM)) and infrared (IR) light controller tracking in an artificial reality system may include a hybrid, dual-band, and dual-function image sensor that includes an active pixel array and a set of lock-in pixels distributed at different regions of the active pixel array in the image sensor. The active pixel array and the set of lock-in pixels may be sensitive to light in both the visible band and the infrared band. The image sensor can perform dual functions simultaneously. For example, the active pixel array may be used to capture visible light images, while the lock-in pixels may be used as lock-in detectors to detect infrared light pulses for controller tracking even when the ambient light intensity is high. In some embodiments, a filter may be used in front of the lock-in pixels to only allow infrared light to pass through. Various inventive embodiments are described herein, including devices, systems, methods, materials, and the like.

In some artificial reality systems, to provide a more immersive artificial reality experience to users, the motions of a user, such as the motions of the arms and/or hands of the user, may be tracked using a controller that is held by or attached to the user, and may be used as the inputs to the AR system for generate and display corresponding content. For example, the controller may include a light source that can transmit invisible light, such as IR light (e.g., near infrared (NIR) light), and the invisible light transmitted by the light source may be captured by a camera on a head-mounted device or a console of an artificial reality system. The locations of the controller and thus the positions of the user's body (e.g., arms and/or hands) may be determined based on the locations of the images of the light source in the captured images. In many cases, it is desirable that the camera for capturing the images of the light source for controller tracking is a broadband camera (e.g., sensitive to both visible light and IR light, such as light from about 400 nm to about 1000 nm) that can also be used, for example, for visual SLAM. However, in a broadband camera, when the ambient light is strong, such as in direct sun light, the intensity of the ambient light may be much higher than the intensity of the IR light emitted by the light source on the controller, and thus the signal-to-noise ratio (SNR) of the signals measured by the broadband camera for controller tracking may be too low to accurately track the controller as the ambient light contributes to a majority of the noise and may even saturate the detectors.

According to certain embodiments, the invisible light source (e.g., an NIR light emitting diode) on the controller may be modulated at a certain frequency by a modulation signal or control signal to generate pulsed light signals. The modulation signal may also be used as a reference signal by a camera to capture and extract the modulated invisible light emitted by the invisible light source. In at least some areas of the image sensor of the camera for visible light and infrared light imaging, the photodiodes of two adjacent pixels may be merged (e.g., using an implant mask during the photodiode implantation process) and the transfer gates of the two adjacent pixels may be switched by two signals synchronized (e.g., frequency-locked) to the modulation signal and having different phases. For example, one transfer gate in the two adjacent pixels may be switched by a signal in-phase with the modulation signal, and thus may capture the modulated invisible light at the maximum intensity (e.g., peak amplitude). The other transfer gate in the two adjacent pixels may be switched by a signal that is out-of-phase (e.g., offset by) 90° with the modulation signal, and thus may capture the modulated invisible light at the minimum intensity (e.g., zero amplitude). Thus, the detection signal accumulated on one pixel in the two adjacent pixels may include the maximum contribution from the light source for controller tracking and the contribution from the ambient light, while the detection signal accumulated on the other pixel in the two adjacent pixels may include the contribution from the ambient light and the minimum (e.g., zero) contribution from the light source for controller tracking. Therefore, a differential signal between the two detection signals from the two adjacent pixels may have the ambient light signal removed and thus may only include the contribution from the modulated invisible light. As such, the differential signal may have a higher SNR to more accurately indicate whether the image of the light source is in the area where the two adjacent pixels are located, even if the ambient light has a high intensity. In other words, only the time varying signals (e.g., modulated pulses), but not the DC signals (e.g., ambient light), are sampled by the two adjacent pixels. In this way, the two adjacent pixels may form a single lock-in pixel or lock-in detector that is frequency locked to the light source and may demodulate the detection signals generated by the photodiode to remove noise (e.g., DC noise) and recover a baseband signal associated with the modulated invisible light emitted by the light source.

In some embodiments, the image sensor with lock-in pixels may be made by modifying a conventional CMOS image sensor to merge the photodiodes in each respective pair of adjacent pixels selected from different areas of the images sensor. For example, one or more adjacent pairs of pixels may be selected in each tile (e.g., a 8×8 or 64×64 tile) or sub-region of the image sensor. The shallow trench isolation (STI) and/or the p-well between the two pixels in each respective adjacent pair of pixels may not be used such that the P regions of the photodiodes in the pair of pixels may be shorted and the N regions of the photodiodes in the pair of pixels may be shorted to form a single shared photodiode. The pairs of pixels may be distributed in different regions according to a certain pattern. The different regions may correspond to different fields of views of the image sensor or the camera. Thus, the image sensor with lock-in pixels may be able to detect the controller in different fields of view. In some embodiments, a phase shift between the detected light signal for controller tracking and the modulation signal (e.g., reference signal) may be determined based on the two detection signals from the two adjacent pixels and may be used to determine the distance or depth of the controller from the camera.

The image sensor disclosed herein can be used for both visible and invisible light imaging, and can detect light signals and achieve a high SNR even when the background noise is high. For example, techniques disclosed herein may enable simultaneous visual light SLAM and IR light controller tracking using a same image sensor. The image sensor may detect the IR light for controller tracking even when the visible light from the ambient environment has a much higher intensity. In addition, the image sensor can be modified from standard complementary metal-oxide-semiconductor (CMOS) image sensors, such as 4-transistor (4T) active pixel sensor (APS) or 5-transistor (5T) global shutter APS, and can be fabricated using CMOS processing techniques. Furthermore, techniques disclosed herein can be used in other imaging or detection systems, such as depth sensing systems (e.g., structured light or stereo imagers), to handle high ambient or low signal light issues. Techniques disclosed herein can also be used for eye tracking in augmented reality systems in order to detect IR light for eye tracking when the ambient light has a high intensity.

Techniques described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using LED-based display subsystem.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive.

The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system 100 including a near-eye display 120 in accordance with certain embodiments. Artificial reality system 100 shown in FIG. 1 may include near-eye display 120, an optional external imaging device 150, and an optional input/output interface 140, each of which may be coupled to an optional console 110. While FIG. 1 shows an example of artificial reality system 100 including one near-eye display 120, one external imaging device 150, and one input/output interface 140, any number of these components may be included in artificial reality system 100, or any of the components may be omitted. For example, there may be multiple near-eye displays 120 monitored by one or more external imaging devices 150 in communication with console 110. In some configurations, artificial reality system 100 may not include external imaging device 150, optional input/output interface 140, and optional console 110. In alternative configurations, different or additional components may be included in artificial reality system 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (µLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system 100 and receive position information of near-eye display 120, acceleration information of near-eye display 120, velocity information of near-eye display 120, predicted future positions of near-eye display 120, or any combination thereof from headset tracking module 114. Virtual reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
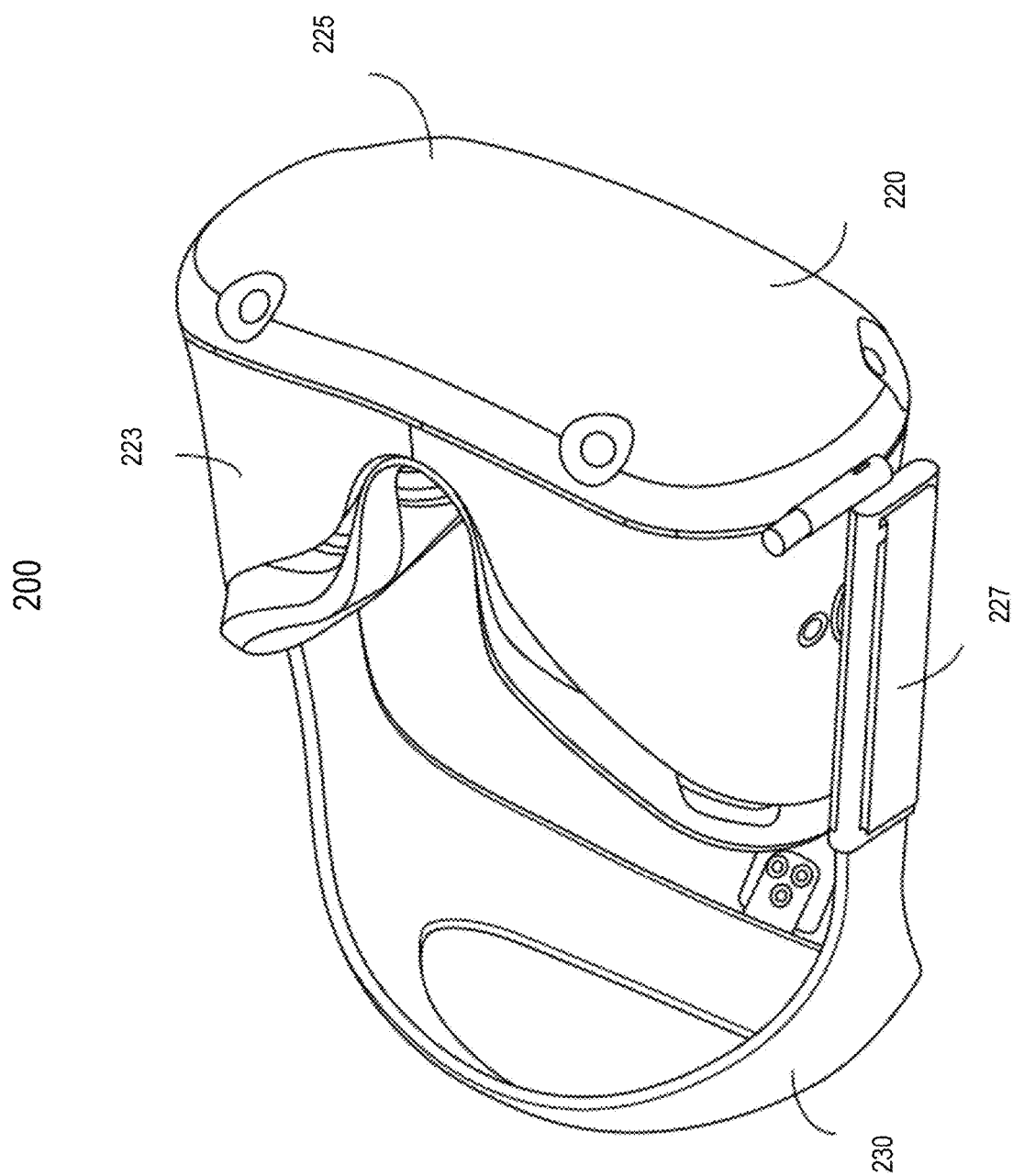
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a top side 223, a front side 225, and a right side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a µLED display, an AMO-LED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. For example, as described above, in some embodiments, the sensors may include an image sensor for tracking the locations of controllers or user's hands and controlling the displayed content based on the locations of the controllers or the user's hands. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
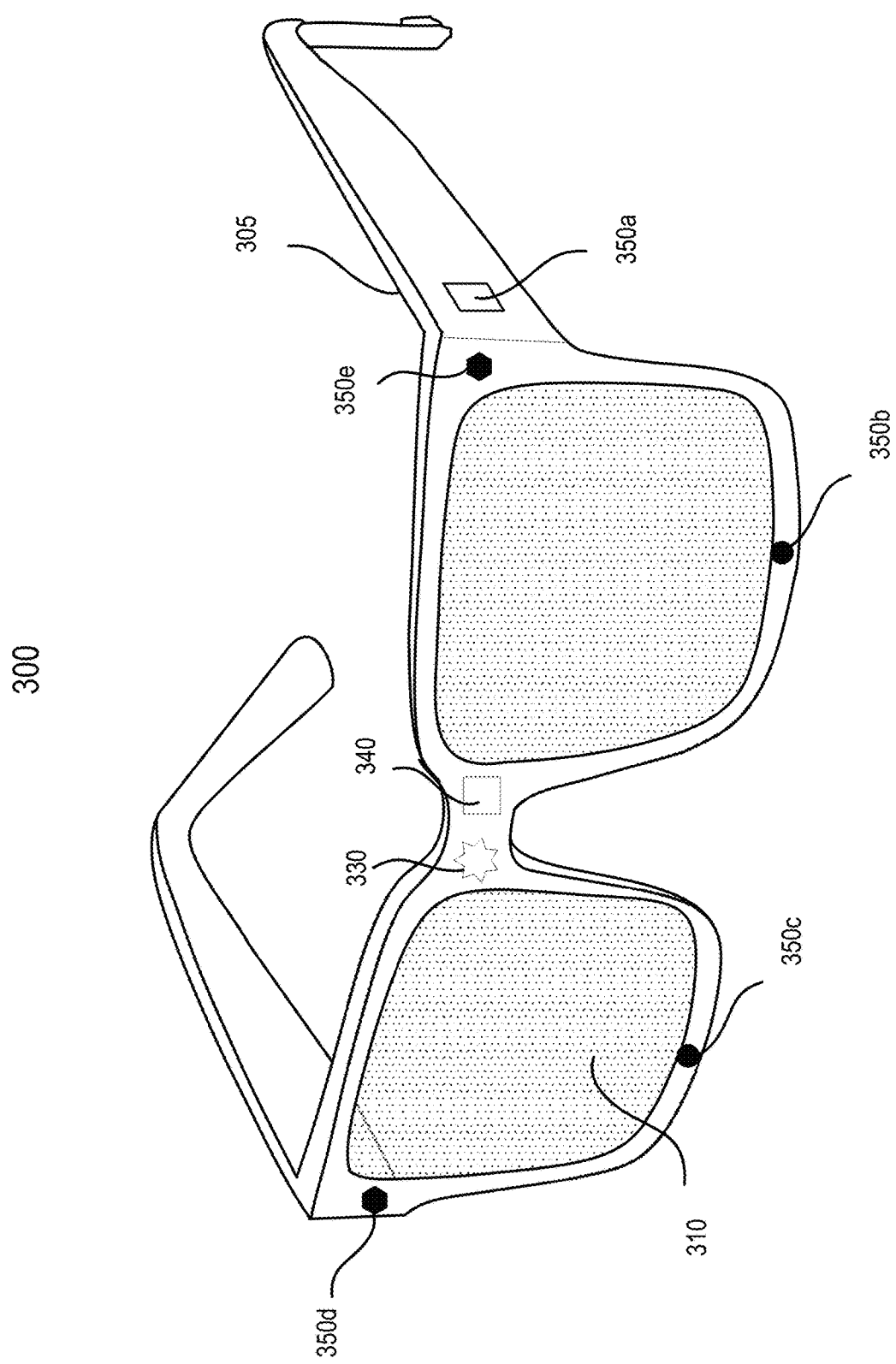
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. For example, in some embodiments, sensors 350a-350e may include an image sensor for capturing images of user input devices, such as controllers or user's hands, in order to track the locations of the controllers and use the locations of the controllers or the user's hands to control the displayed content. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light pattern onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

As described above, one or more imaging devices (e.g., imaging device 150 or sensors 350a-350e) on a console (e.g., console 110) or a near-eye display (e.g., near-eye display 120, HMD device 200, or near-eye display 300) may be used to track input/output devices, such as tracking the location or position of a controller or a hand of the user to determine the motions of the user, in order to modify or generate images of real or virtual objects accordingly, thereby providing a more immersive experience for the user. The imaging device may generally include an image sensor, such as a charge-coupled device (CCD) image sensor or a CMOS image sensor that includes an array of photosensitive pixels.

Figure 4:
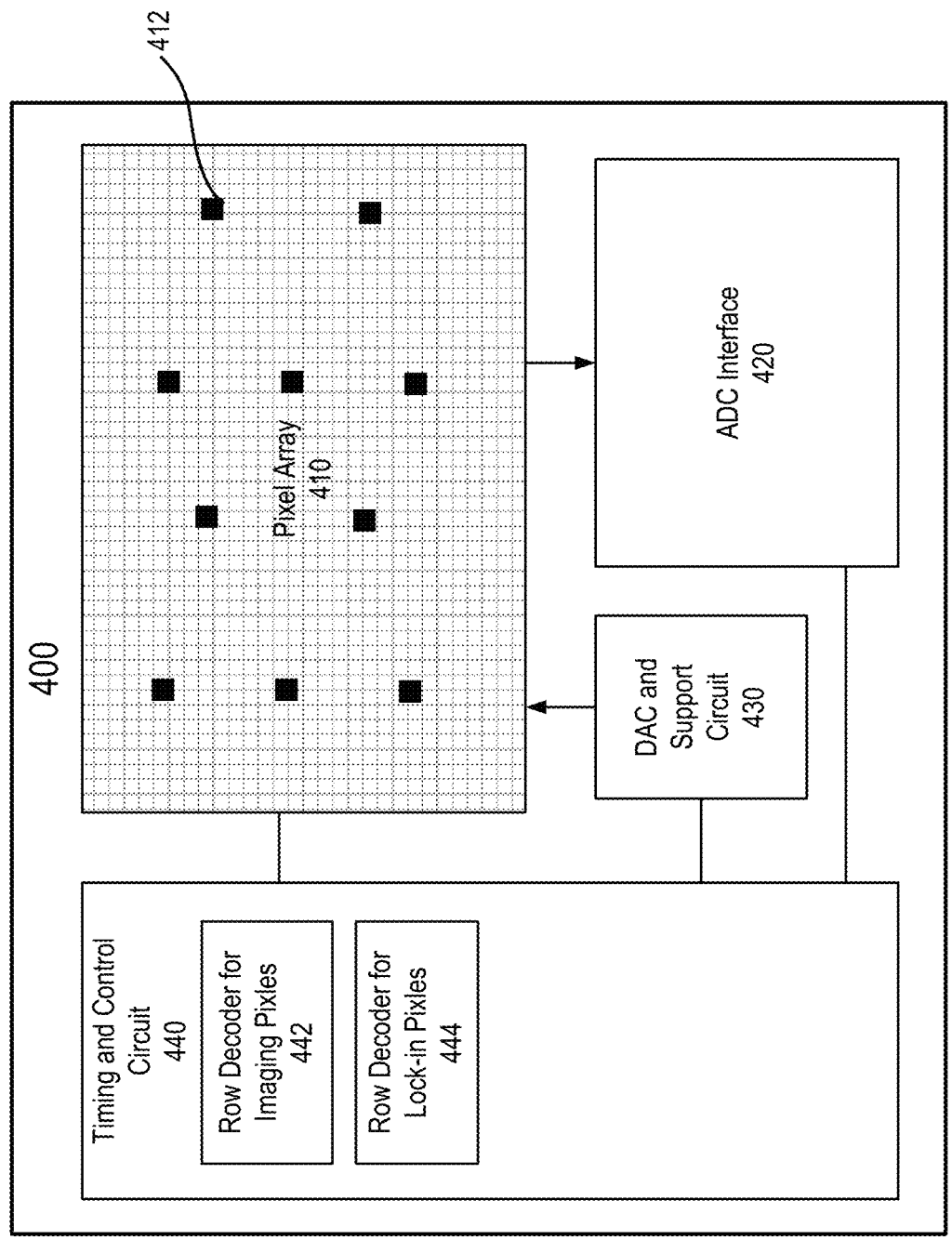
FIG. 4 is a simplified block diagram of an example of an image sensor according to certain embodiments.

FIG. 4 is a simplified block diagram of an example of an image sensor 400 according to certain embodiments. In some implementations, image sensor 400 may be a CMOS active pixel image sensor. Image sensor 400 may include a pixel array 410, an ADC interface 420, a digital-to-analog converter (DAC) and support circuit 430, and a timing and control circuit 440. Pixel array 410 may include a plurality of pixels arranged in a two-dimensional array. Each pixel in pixel array 410 may include a photo sensor, such as a photodetector or photodiode, that can generate an electrical voltage or current signal corresponding to the intensity of the optical signal illuminating the pixel. For example, each pixel may convert the optical signal on the pixel to an electrical current. Each pixel in pixel array 410 may also include an analog storage device, such as a capacitive device that may integrate the current by storing the charges to generate a voltage signal, which may be referred to as an analog detection signal representing gray-level/color information for the pixel. Some pixels in pixel array 410 may be merged to form lock-in pixels 412 as described in detail below.

Timing and control circuit 440 may include a row decoder and driver circuit 442 and/or a column decoder and driver circuit at the boundary of pixel array 410 for selectively activating one or more pixels (e.g., a row of pixels) to send the analog detection signal to ADC interface 420. Timing and control circuit 440 may also include a row decoder and driver circuit 444 for lock-in pixels in pixel array 410, where the lock-in pixels and other pixels (e.g., imaging pixels) in pixel array 410 may operate at different frequencies and/or duty cycles.

ADC interface 420 may include a plurality of ADC devices and may be local or global. For example, in some implementation, image sensor 400 may include an ADC for each pixel (and thus each pixel may be referred to as a digital pixel), and may be implemented using three-dimensional integrated circuit architectures where the lock-in pixels may be implemented in different array architectures. In some implementations, the ADC devices may each correspond to a column of pixels and may be used to convert the analog detection signals from the pixels to digital image data one row at a time. Each ADC device may include two inputs, one for a reference signal and the other for the analog detection signals from the pixels. The reference signal may be generated by, for example, digital-to-analog converter (DAC) and support circuit 430. The analog detection signal from each pixel may be converted into digital data by the ADC device based on the reference signal. Digital data from each row of pixels may be saved in a digital image data file to form an image frame.

In some embodiments, each ADC may include an internal offset correction circuit and a correlated double sampling (CDS) circuit configured to reduce noise, such as fixed pattern noise (FPN) caused by parameter variations from pixel to pixel. The CDS circuit may also be a stand-alone unit outside of ADC interface 420. The CDS operation may be done by, for example, sampling and holding a reference or reset signal, sampling and holding the analog detection signal, and subtracting the reference signal from the analog detection signal to generate a correlated analog detection signal. The correlated analog detection signal may then be converted by the ADC into digital image data.

In some embodiments, each pixel in pixel array 410 may include, for example, a five-transistor (5T) global shutter active pixel, a 4-transistor (4T) APS pixel, or a 3-transistor (3T) APS pixel. For example, a 3T pixel in a pixel array may include a photodetector (e.g., a pinned photodiode), a reset gate, a selection gate, a source-follower amplifier transistor, and a capacitive device (e.g., a parasitic capacitor at the gate of the source-follower amplifier transistor). The reset gate may include a transistor, such as a metal-oxide-semiconductor field-effect transistor (MOSFET), and may be turned on to clear the charge stored on the capacitive device or otherwise set the capacitive device to a voltage level. During exposure, charges generated by the photodetector may be stored on the capacitive device to generate an analog detection signal (e.g., a voltage signal). When the pixel is selected by activating the corresponding selection gate using, for example, a row selection signal, the analog detection signal at the capacitive device may be amplified by the source-follower amplifier transistor and sent to a readout bus (e.g., a column line) to be converted to digital image data by an ADC for the corresponding column. In some implementations, multiple pixels may share some gates to reduce the total number of gates used for the image sensor.

Figures 5A, 5B:
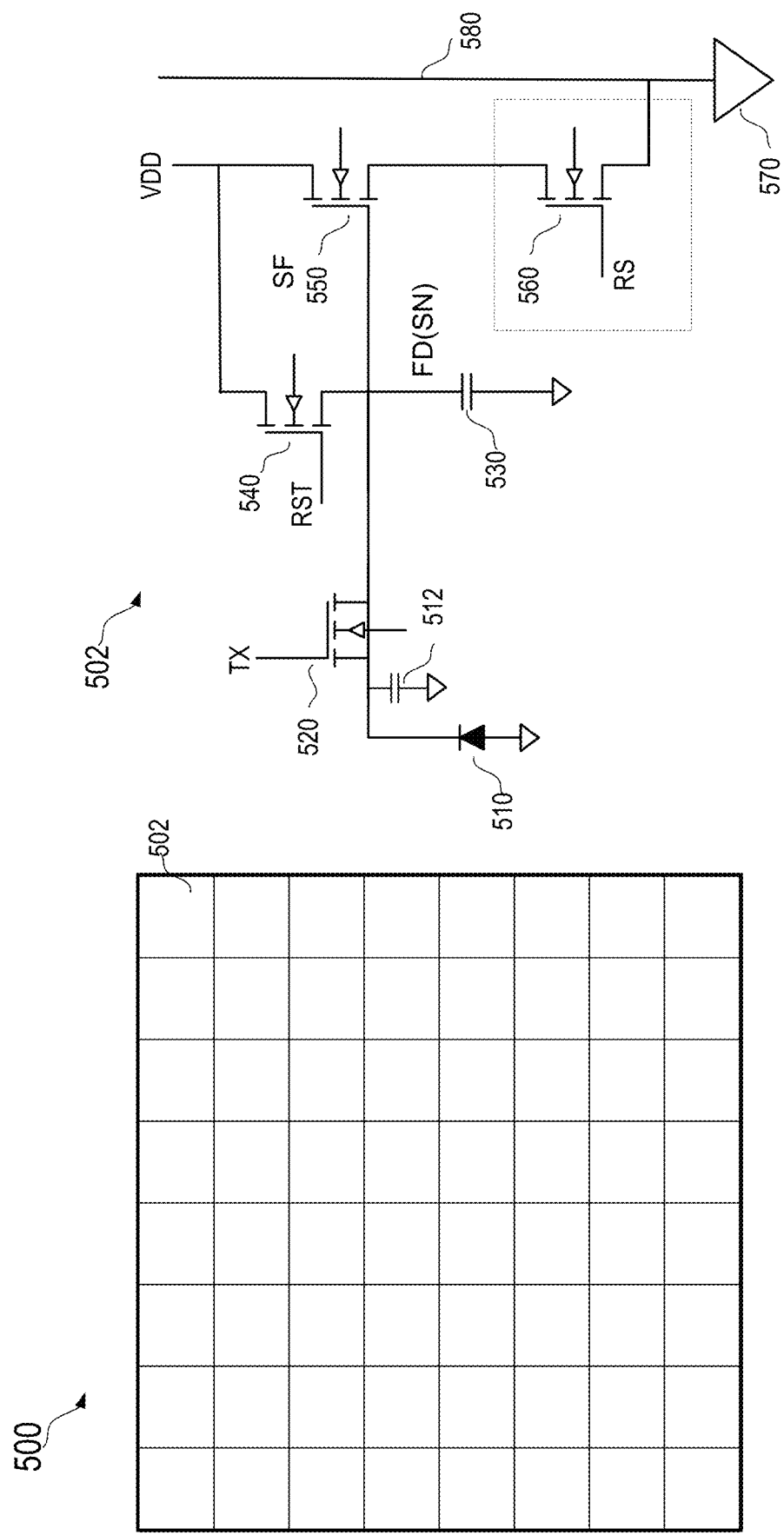
FIG. 5A illustrates an example of an image sensor including a two-dimensional array of active pixels.
FIG. 5B illustrates an example of an active pixel in an image sensor.

FIG. 5A illustrates an example of a two-dimensional array 500 of active pixels 502 in an image sensor. Two-dimensional array 500 may be an example of pixel array 410 shown in FIG. 4. Two-dimensional array 500 may include, for example, 500×500, 640×480, 800×600, 1028×768, 1500×1500, or more active pixels 502. In some embodiments, active pixels 502 may include 4T pixels.

FIG. 5B illustrates an example of an active pixel 502 in two-dimensional array 500. Active pixel 502 may be a 4T transistor that includes a photodetector (e.g., a pinned photodiode (PD) 510), a transfer gate 520, a capacitive storage device (e.g., a storage node (SN), such as a floating diffusion (FD) capacitor 530), a reset gate 540, a source-follower readout transistor 550, and a selection gate 560. Transfer gate 520, reset gate 540, source-follower readout transistor 550, and selection gate 560 may be implemented using transistors, such as MOSFETs. Pinned photodiode 510 may convert optical signals to electrical signals and store the electrical signals as charges at a capacitive device, such as a parasitic capacitor 512 at pinned photodiode 510. The stored charges can be transferred to FD capacitor 530 through transfer gate 520. Reset gate 540 may be used to reset FD capacitor 530 to a known voltage level. The gate of selection gate 560 may be connected to a selection signal, such as a row selection signal, to selectively couple FD capacitor 530 to a readout bus (e.g., a column line 580) through source-follower readout transistor 550, which may amplifier the voltage signal from FD capacitor 530. In a 5T global shutter pixels, the charges generated by the pinned photodiode may be transferred to the storage node (e.g., FD capacitor 530) and then read sequentially either at the same time or at a different time.

During the operation of active pixel 502, before the exposure of each line of pixels, charges stored at parasitic capacitor 512 may be cleared or discharged using, for example, a shutter signal, and reset gate 540 may be turned on to clear the charge stored on FD capacitor 530. Optionally, the voltage level on FD capacitor 530 after reset (i.e., the reset level) may be read out. During exposure, charges generated by the photodetector (e.g., photodiode 510) may be stored on parasitic capacitor 512 at photodiode 510. At the end of the exposure, the charges may be transferred to FD capacitor 530 through transfer gate 520. Alternatively, the charges may be transferred to FD capacitor 530 through transfer gate 520 during the exposure period. Photodiode 510 may have a low dark current and a good blue response, and, when coupled with a transfer gate, may allow complete charge transfer from photodiode 510 to FD capacitor 530. The charges may cause a voltage change at FD capacitor 530. When the pixel is selected by activating corresponding selection gate 560, the voltage signal (i.e., the analog detection signal) at FD capacitor 530 may be amplified by source-follower readout transistor 550, and sent to column line 580. An ADC 570 connected to column line 580 may then convert the amplified voltage signal to digital image data.

Figure 6:
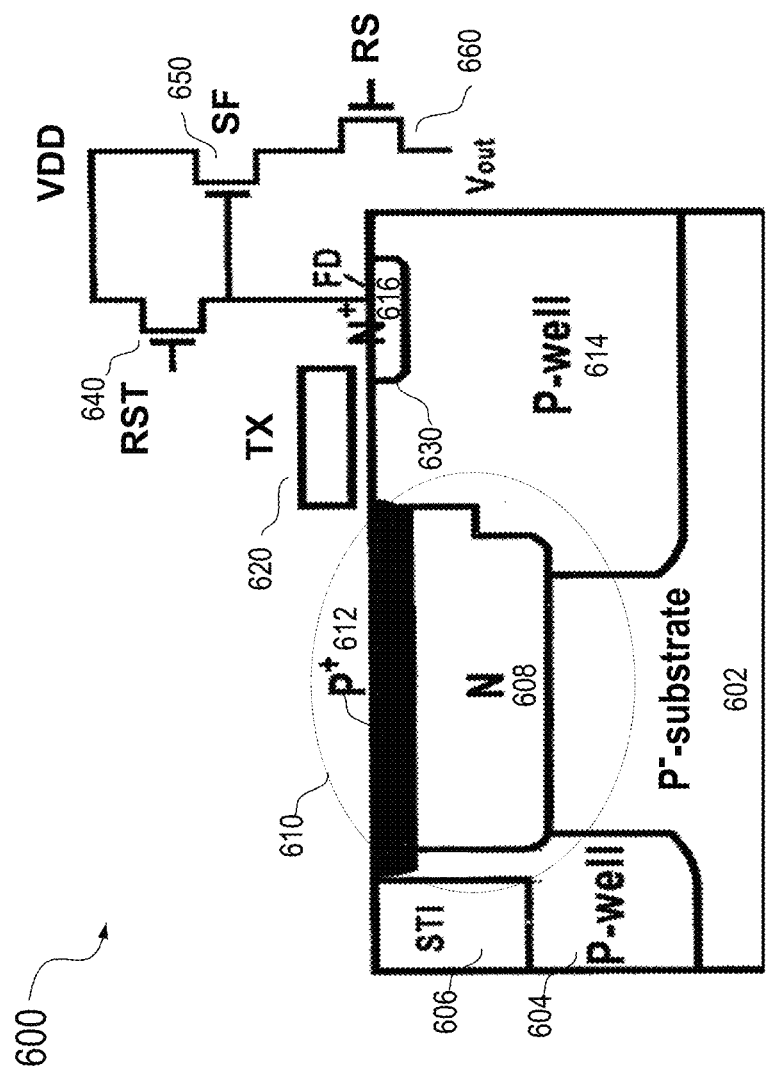
FIG. 6 illustrates the schematic and cross-sectional view of an example of a pixel in an image sensor.

FIG. 6 illustrates the schematic and cross-sectional view of an example of a pixel 600 in a CMOS image sensor, such as active pixel 502 in two-dimensional array 500. As active pixel 502, pixel 600 may include a photodiode 610, a transfer gate 620, a reset gate 640, a storage node 630 (e.g., a floating diffusion node), a source follower 650, and a selection gate 660. Photodiode 610 may include a pinned photodiode. Storage node 630 may include a floating diffusion node that converts a charge or current signal from to a voltage signal. Transfer gate 620 may be used to isolate photodiode 610 from or connect photodiode 610 to storage node 630, based on the voltage applied on the gate terminal of transfer gate 620. Reset gate 640 may be used to reset storage node 630 to a certain voltage level, such as close to zero volt. Source follower 650 may enable the low impedance readout of the voltage level at storage node 630. Selection gate 660 may be a column or row selection gate that sends the readout signal from pixel 600 to a column or row bus.

One example of the cross-sectional view of photodiode 610, transfer gate 620, and storage node 630 is shown in FIG. 6. As illustrated in the example, photodiode 610 may be a pinned photodiode including a buried channel photodiode that includes a $p^+np^-$ structure on a p or $p^-$-substrate 602, where a $p^+$ implant layer 612 of the $p^+np^-$ structure is referred to as the pinning implant. $p^+$ implant layer 612 pins the surface of photodiode 610 at the substrate potential, suppresses the noise caused by interface traps located at the surface of photodiode 610 and transfer gate 620, and reduces the dark currents. The pixels in the CMOS image sensor may be isolated by a shallow trench isolation (STI) 606, which may be surrounded by a p-well 604. The doping density of p-well 604 may be higher than that of an n-type region 608 of photodiode 610, such that the sidewalls and edges of STI 606 can be isolated from the depletion region during the integration time to reduce the dark current.

Transfer gate 620 may include a MOSFET that may be turned on or off by a control signal at the gate of the MOSFET. When transfer gate 620 is turned on, the photo-generated charges may be transferred from photodiode 610 to the floating diffusion node of storage node 630. The floating diffusion node may be formed by implanting and diffusing an n-type dopant into a p-well 614 or a $p^-$-substrate 602 to form an $n^+$ region 616 and thus a diode that includes $n^+$ region 616 and p-well 614. During operation, $n^+$ region 616 (e.g., the diffusion region) of the diode may be reset to a positive potential by reset gate 640 and then allowed to float. When photo-generated charges are subsequently injected into the floating diffusion node, the voltage of the floating diffusion node may change accordingly.

Photodiode 510 or 610 described above may be sensitive to light in a broad band, such as from about 350 nm to about 1050 nm. Thus, the photodiode may be used to detect both visible light and infrared light, such as near infrared light. For example, as described above, an image sensor including the photodiodes described above may be used for both visible light imaging (e.g., visual SLAM) and infrared light imaging (e.g., controller tracking). However, the invisible light may cause noise in visible light imaging, while the visible light may cause noise in infrared imaging. In many circumstances, such as during the day time, the intensity of the visible light may be much higher than the intensity of the infrared light for controller tracking, and thus the noise caused by the visible light may be very high during controller tracking using infrared light. In some embodiments, a filter may be used in front of the image sensor to filtering out visible light or infrared light. However, with the filter, the image sensor may not be used for both visible light imaging and infrared light imaging. In some embodiments, the integration time of the pixel may be reduced to avoid saturation, but the detected signal may still include a large amount of noise due to the strong ambient light.

According to certain embodiments, lock-in pixels may be formed in certain selected regions of the image sensor by merging the photodiodes of pairs of adjacent pixels. The lock-in pixel may function as a lock-in detector to measure small signals in noisy or high ambient environments. As described above, the infrared light source on the controller or other input devices may be modulated by a reference signal, such as a sinusoidal or rectangular wave signal at a certain frequency, to generate light pulses, where the frequency of the pulses is the same as the frequency of the reference signal. The lock-in pixels can lock to the pulsed infrared light signal by sampling (and thus demodulating) the pulsed light signals at a sampling frequency equal to the frequency of the reference signal, rather than constantly sampling the light signals. For example, the pulsed light signals may be sampled by one pixel in the two adjacent pixels when the intensity of the pulsed light signals is the highest, and may be sampled by the other pixel in the two adjacent pixels when the intensity of the pulsed light signals is the lowest. The two output signals from the two adjacent pixels may also include the same contribution by the ambient light. Therefore, a differential signal between the two output signals from the two adjacent pixels may have the ambient light signal canceled out and thus may only include the contribution from the modulated invisible light. In other words, only the time varying signals (e.g., the modulated pulses), but not the DC signals (e.g., ambient light), are sampled by the two adjacent pixels. As such, the differential signal from the two adjacent pixels may have a higher SNR to more accurately indicate whether the image of the light source is in the area where the two adjacent pixels are located, even if the ambient light has a high intensity.

Figure 7A:
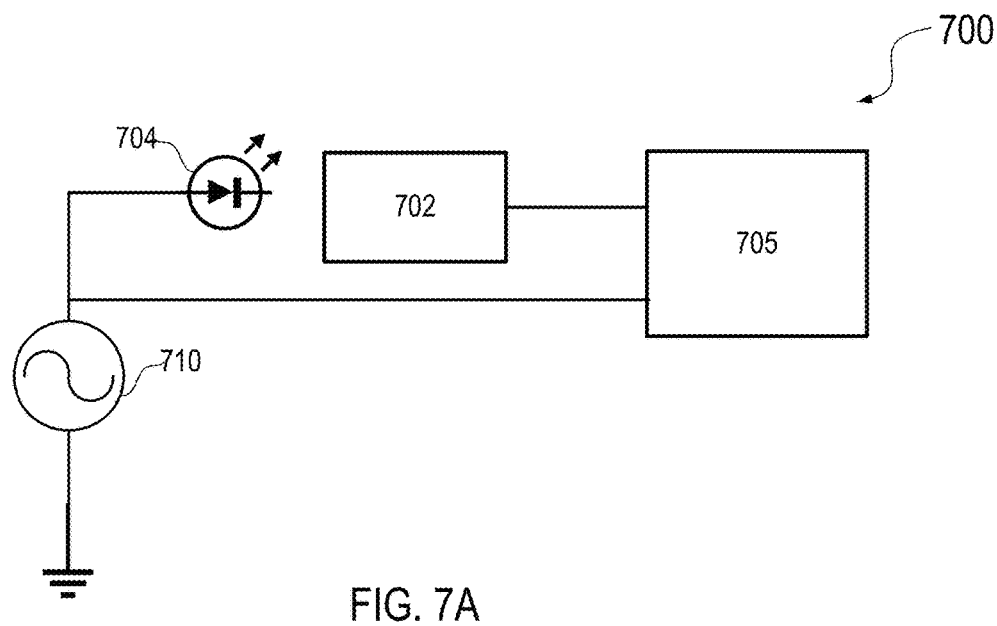
FIG. 7A is a simplified block diagram of an example of a lock-in detector according to certain embodiments.

FIG. 7A is a simplified block diagram of an example of a lock-in detection system 700 for controller tracking according to certain embodiments. Lock-in detection system 700 may include a signal source 710 that may generate a reference signal at a certain frequency, such as, for example, about 50 MHz to about 150 MHz. The reference signal may include, for example, a sinusoidal signal, a rectangular wave signal, a triangle wave signal, a square wave signal, or the like. The reference signal generated by signal source 710 may be used to modulate a light source 704, such as an infrared laser diode or an infrared LED on a controller of an artificial reality system described above. Thus, light source 704 may generate a pulsed light signal towards, for example, an image sensor on a console or a head-mounted device of the artificial reality system. A photodiode 702 in the image sensor and illuminated by the pulsed light signal may generate a detection signal, such as a voltage signal. The detection signal may be processed by a lock-in amplifier 705 to extract a signal corresponding to the pulsed light signal and determine the amplitude and/or phase of the signal corresponding to the pulsed light signal. Lock-in amplifier 705 may generate or receive the reference signal, and then mix the detection signal and the reference signal to demodulate the detection signal. A low pass filter may be applied to the demodulated signal. In this way, the frequency component at the reference frequency in the detection signal may be isolated from other frequency components by the demodulation or down-mixing, which may also be referred to as heterodyne detection.

Figure 7B:
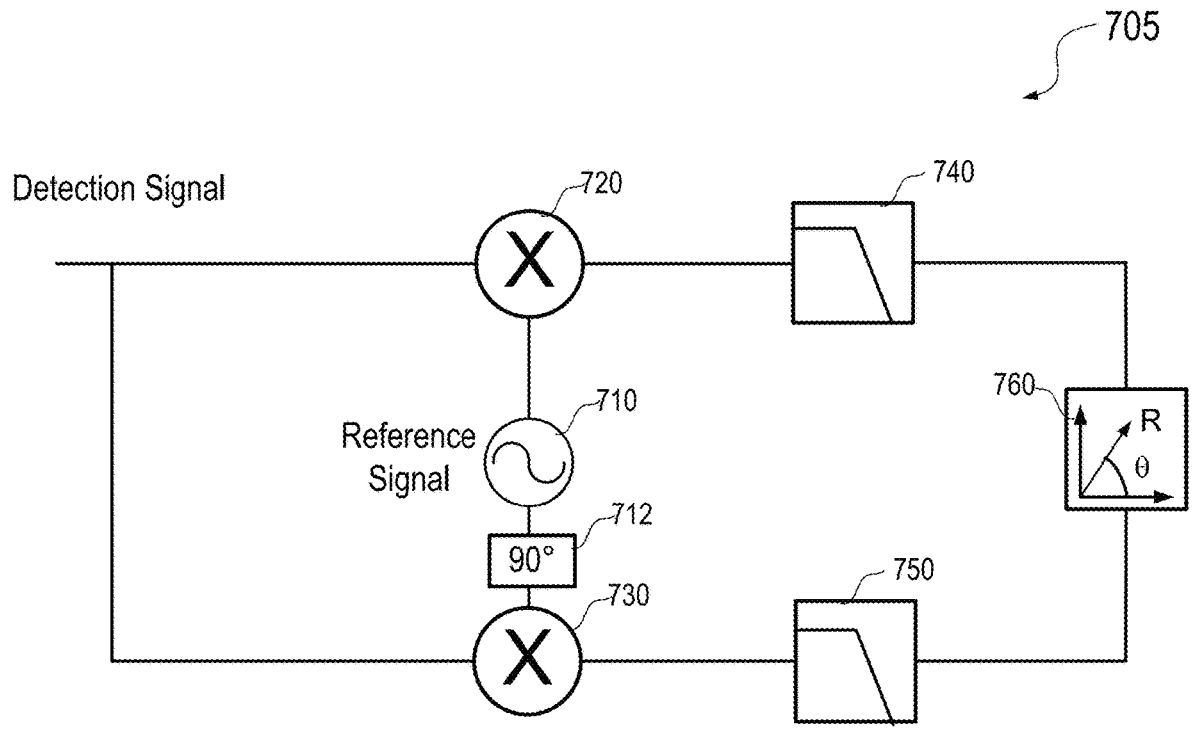
FIG. 7B is a simplified block diagram of an example of a lock-in amplifier in a lock-in detector according to certain embodiments.

FIG. 7B is a simplified block diagram of an example of lock-in amplifier 705 in a lock-in detector according to certain embodiments. The inputs to lock-in amplifier 705 may include the detection signal generated by photodiode 702 and the reference signal generated by signal source 710. Lock-in amplifier 705 may include a first mixer 720 and a second mixer 730. First mixer 720 may be an in-phase mixer that mixes the detection signal and the reference signal to down-convert the detection signal to an in-phase baseband signal I and higher order harmonic signals. The in-phase baseband signal I and the higher order harmonic signals may be filtered by a first low-pass filter 740 to block the high order harmonic signals and isolate the in-phase baseband signal I. Second mixer 730 may be an quadrature-phase mixer that mixes the detection signal and the reference signal that is phase shifted by 90° by a phase shifter 712, such that the detection signal may be down-converted to a quadrature-phase baseband signal Q and some high order harmonic signals. The quadrature-phase baseband signal Q and the high order harmonic signals may be filtered by a second low-pass filter 750 to remove the high order harmonic signals. The amplitude A and phase B of the pulsed infrared light signal generated by light source 704 and detected by photodiode 702 may then be determined by a post processor 760 based on in-phase baseband signal I and the quadrature-phase baseband signal Q:

$$A = \sqrt{I^2 + Q^2}, \text{ and}$$

$$\theta = \arctan\left(\frac{Q}{I}\right).$$

In some embodiments, the difference in amplitude between the in-phase baseband signal I and the quadrature-phase baseband signal Q may be determined by post processor 760 to remove the common background noise and achieve a higher SNR.

According to certain embodiments, the lock-in detector including the photodiode 702 and lock-in amplifier 705 described above may be implemented using two adjacent pixels that share the photodiodes and transfer the photo-generated charges from the photodiode to two different storage nodes at different time instants. For example, the photodiodes of the two adjacent pixels may be shorted or merged, and transfer gates (or other switches) of the two adjacent pixels may be controlled by the reference signal and a 90° phase-delayed version of the reference signal, such that the photo-generated charges from the shared photodiodes may be alternately sampled and transferred to the floating diffusion nodes of the two adjacent pixels with a delay of a quarter period or a 90° phase of the reference signal. Thus, each of the transfer gate (or other switch) may function as a mixer that mixes the charge or current signal generated by the shared photodiodes with the reference signal or a delayed version of the reference signal. Because the down-converted or down-sampled signals generate by the two adjacent pixels may include the common background noise caused by ambient light, a differential signal between the signals generate by the two adjacent pixels may have the common background noise removed to improve the signal-to-noise ratio.

Figure 8:
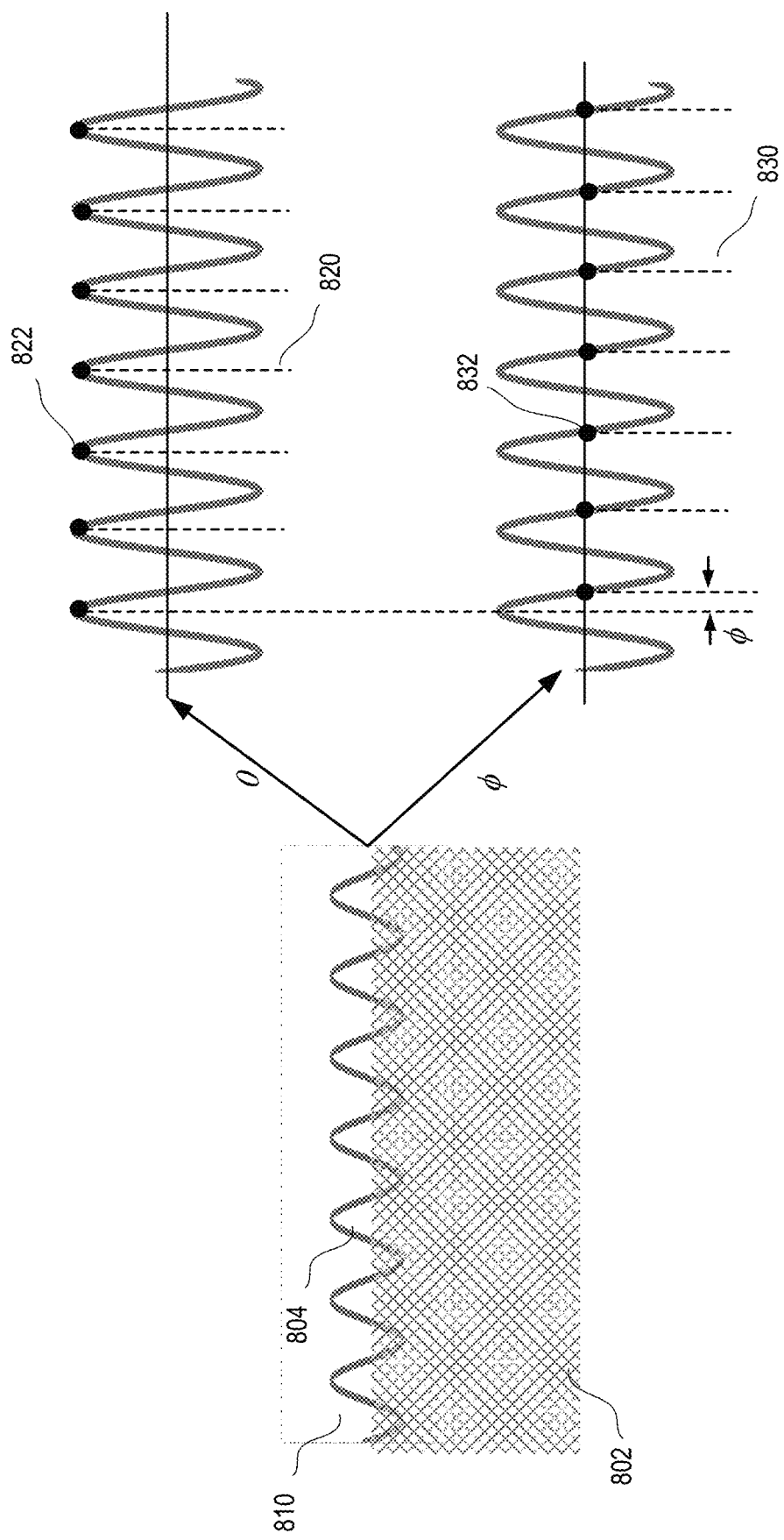
FIG. 8 illustrates an example of using a lock-in pixel for lock-in detection of light pulses when the ambient light intensity is high according to certain embodiments.

FIG. 8 illustrates an example of using a lock-in pixel for lock-in detection of light pulses when the ambient light intensity is high according to certain embodiments. In the illustrated example, a signal 810, such as a charge, current, or voltage signal generated by a photodiode or other photodetector, may include a large background noise component 802 and an AC signal component 804 to be detected. Signal 810 may be sampled by a sampling signal 820 having a frequency equal to the frequency of the AC signal component 804 and in-phase with a reference signal used to modulate the light source to emit the light signal corresponding to the AC signal component 804. As shown in FIG. 8, data points 822 sampled using sampling signal 820 may be at the peaks of AC signal component 804. Signal 810 may also be sampled by a sampling signal 830 having a frequency equal to the frequency of the AC signal component 804 and with a phase delay φ from the reference signal used to modulate the light source to emit the light signal corresponding to AC signal component 804. As shown in FIG. 8, data points 832 sampled using sampling signal 830 may be at the zero amplitude of AC signal component 804. Thus, a difference in value between data points 822 and data points 832 may indicate the amplitude of AC signal component 804, while the large background noise component 802 is removed in the difference. As such, a higher SNR can be achieved.

Figures 9A, 9B:
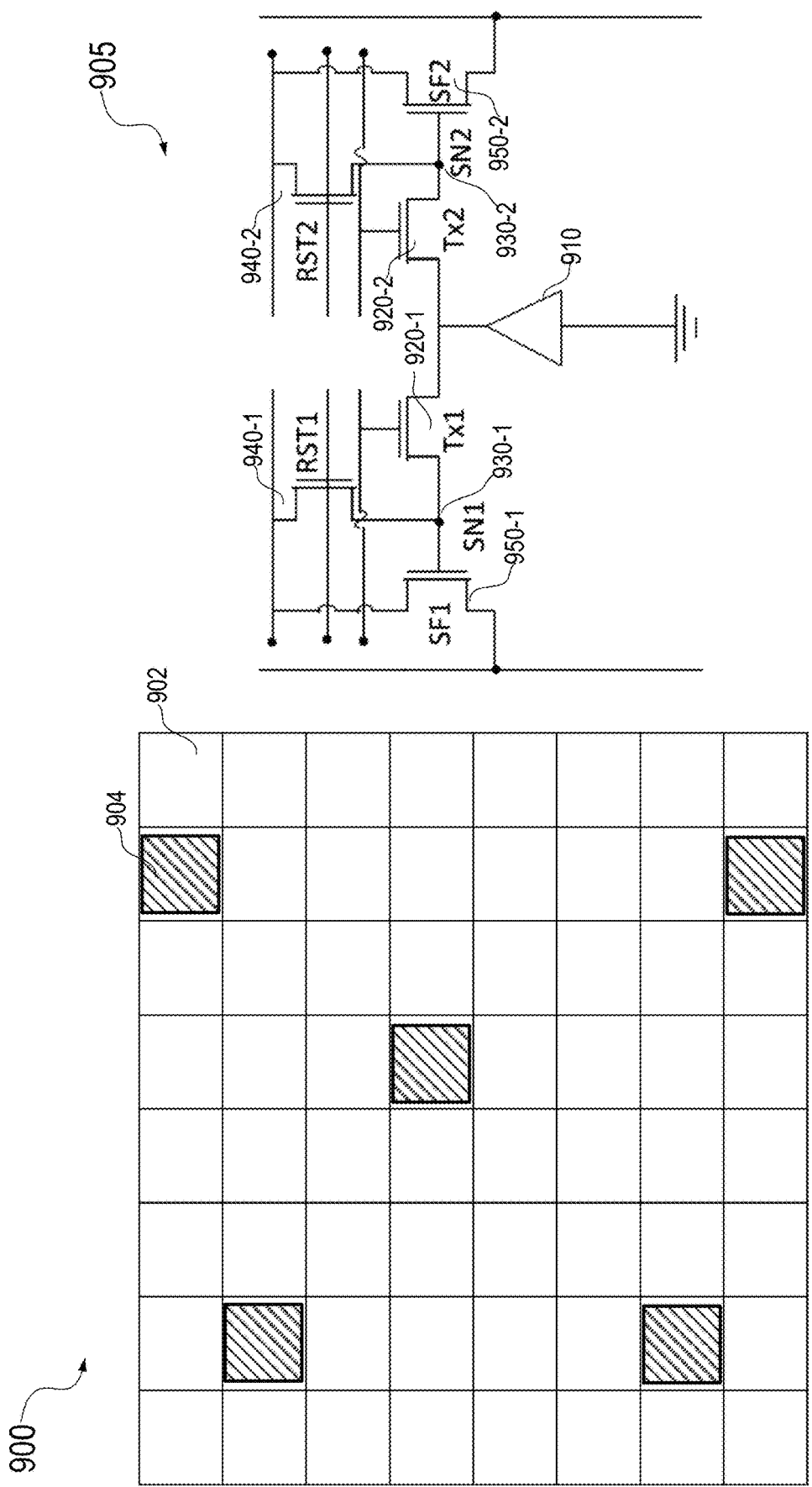
FIG. 9A illustrates an example of an image sensor including distributed lock-in pixels for lock-in detection according to certain embodiments.
FIG. 9B illustrates the schematic of an example of a lock-in pixel in an image sensor according to certain embodiments.

FIG. 9A illustrates an example of an image sensor 900 including distributed lock-in pixels for lock-in detection according to certain embodiments. Image sensor 900 may include a two-dimensional array of pixels that may include, for example, 500×500, 640×480, 800×600, 1028×768, 1500×1500, or more pixels 902. Pixels 902 may include, for example, 3T or 4T active pixels. In some areas 904 on image sensor 900, two adjacent pixels 902 may be combined to form a lock-in pixel. Thus, image sensor 900 may be a hybrid image sensor that includes an array of 3T, 4T, or 5T active pixels and a set of lock-in pixels in different regions of image sensor 900. Each area 904 may include one or more lock-in pixels that each include two adjacent pixels. The locations of areas 904 may be determined based on, for example, the field of view of image sensor 900 and the desired tracking accuracy. In some embodiments, areas 904 may be distributed in image sensor 900 according to a certain pattern. The density of the lock-in pixels on image sensor 900 may be high or low, which may be determined based on, for example, the desired tracking accuracy and the visible light image quality. In some embodiments, the lock-in pixels may be sparsely distributed on image sensor 900. For example, there may be one lock-in pixel in each tile of 4×4 pixels, 5×5 pixels, 6×6 pixels, 8×8 pixels, 16×16 pixels, 32×32 pixels, 64×64 pixels, or the like. In some embodiments, the lock-in pixels may be densely distributed on image sensor 900. In some embodiments, all pixels on image sensor 900 may be lock-in pixels, which may be used for both visible and infrared light imaging and may achieve a higher resolution and SNR for lower intensity light (e.g., infrared light for controller tracking), with a lower resolution and a potentially higher SNR for higher intensity light (e.g., ambient light for visible light imaging). For example, when the ambient light intensity is low or when a visible light signal in a narrow wavelength range needs to be detected, the lock-in pixels may be used for visible light imaging or detection.

FIG. 9B illustrates the schematic of an example of a lock-in pixel 905 in an image sensor according to certain embodiments. In the example shown in FIG. 9B, lock-in pixel 905 may include two 4T pixels that share a common photodiode 910, which may be formed by shorting or merging the individual photodiodes of the two 4T pixels as described in detail below. As described above, a first 4T pixel of lock-in pixel 905 may include photodiode 910, a transfer gate 920-1, a storage node 930-1, a reset gate 940-1, and a source follower 950-1. Similarly, a second 4T pixel of lock-in pixel 905 may include photodiode 910, a transfer gate 920-2, a storage node 930-2, a reset gate 940-2, and a source follower 950-2. The gates and other components in lock-in pixels 905 may be similar to the gates and other components in an active pixel as described above with respect to FIGS. 5B and 6.

Transfer gate 920-1 and transfer gate 920-2 may be individually controlled by different control signals that may have the same frequency but different phases, and thus may be switched on at different time instants and may function as mixers for down-converting or down-sampling the charge signals generated by photodiode 910. For example, transfer gate 920-1 may be turned on when the intensity of the light signal to be detected is high, while transfer gate 920-2 may be turned on when the intensity of the light signal to be detected is low. Thus, the voltage level at storage node 930-1 may be higher than the voltage level at storage node 930-2, and the difference between the voltage level at storage node 930-1 and the voltage level at storage node 930-2 may indicate the amplitude of the light signal to be detected.

Figure 10A:
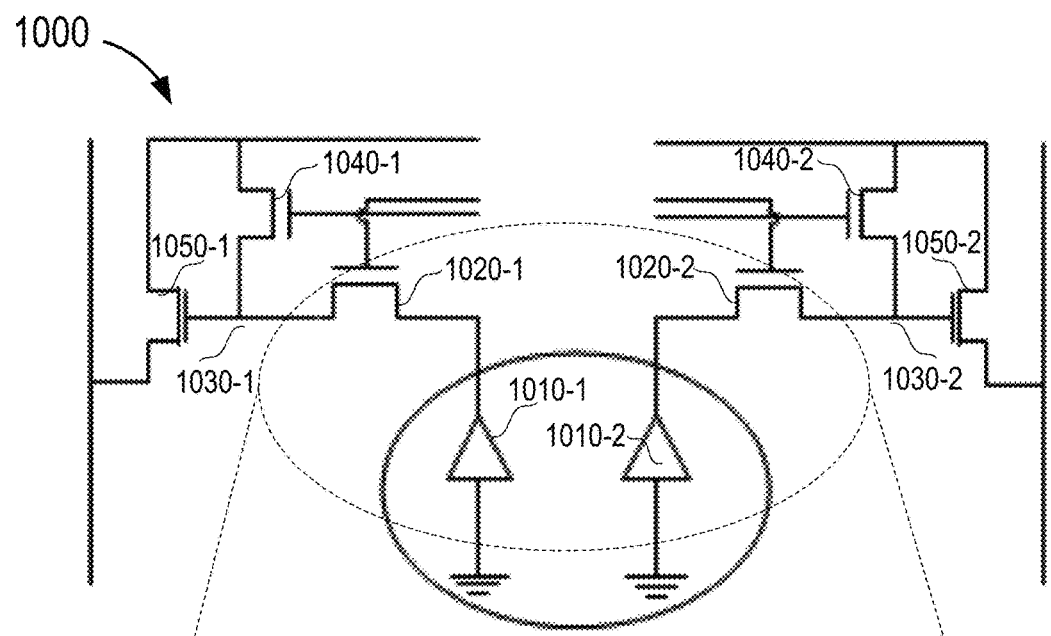
FIG. 10A illustrates the schematic of an example of a lock-in pixel in an image sensor according to certain embodiments.
Figure 10B:
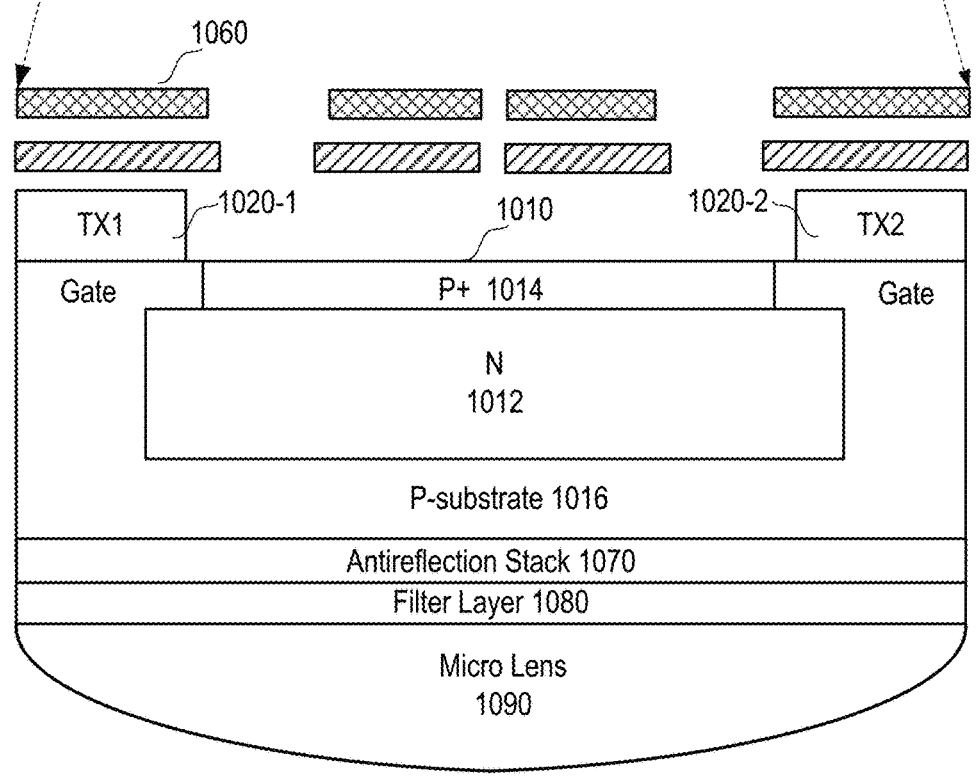
FIG. 10B is a cross-sectional view of a portion of an example of a lock-in pixel in an image sensor according to certain embodiments.

FIG. 10A illustrates the schematic of an example of a lock-in pixel 1000 in an image sensor (e.g., image sensor 400 or 900) according to certain embodiments. FIG. 10B is a cross-sectional view of a portion of the example of lock-in pixel 1000 in the image sensor according to certain embodiments. Lock-in pixel 1000 may include two pixel elements, such as two 4T active pixels, arranged in a symmetrical manner such that photodiodes 1010-1 and 1010-2 of the two 4T pixels are adjacent to each other or are physically merged into one larger photodiode. A first 4T pixel of lock-in pixel 1000 may include photodiode 1010-1, a transfer gate 1020-1, a storage node 1030-1, a reset gate 1040-1, and a source follower 1050-1. Similarly, a second 4T pixel of lock-in pixel 1000 may include photodiode 1010-2, a transfer gate 1020-2, a storage node 1030-2, a reset gate 1040-2, and a source follower 1050-2. The operations and functions of the components of the first and second 4T pixels may be similar to the operations and functions of the components of pixels described above with respect to, for example, FIGS. 5B, 6, and 9B.

Transfer gate 1020-1 and transfer gate 1020-2 may each be switched on or off by a respective control signal. The two control signals for transfer gate 1020-1 and transfer gate 1020-2 may have the same frequency but different phases with respect to the reference signal used to modulate the light source to generated the pulsed light signal. For example, there may be a 90° phase difference between the two control signals, such that transfer gate 1020-1 and transfer gate 1020-2 may be turned on at different time instants to sample the charge signals generated by photodiode 1010-1 and photodiode 1010-2 at the peak amplitude and zero amplitude of the pulsed light signal to be detected. In this way, transfer gate 1020-1 and transfer gate 1020-2 may down-convert or demodulate the charge signals generated by photodiode 1010-1 and photodiode 1010-2, where the control signal may be used as the reference signal (or local carrier) for the mixing or demodulation. The difference between the output signals of the two 4T active pixels may be calculated to remove the DC noise and determine the amplitude of the pulses light signal to be detected.

Because the two 4T pixels in lock-in pixel 1000 are arranged in a symmetrical manner such that photodiodes 1010-1 and 1010-2 of the two 4T pixels are adjacent to each other, photodiodes 1010-1 and 1010-2 can be merged into one larger photodiode 1010 in the example shown in FIG. 10B. As illustrated, photodiode 1010 may include a merged n-type region 1012 formed in a p-substrate 1016. Photodiode 1010 may also include a merged $p^+$ pinning implant region 1014. As described above with respect to FIG. 6, $p^+$ pinning implant region 1014, n-type region 1012, and p-substrate 1016 may form a pinned photodiode including a $p^+$ np structure.

FIG. 10B also shows one or more metal layers 1060 for connecting the transistors, nodes, and control circuits in the pixels of the image sensor. The control circuits and lock-in pixel 1000 may be on the same substrate or may be on different devices. Optionally, optical components may be formed on lock-in pixel 1000 to collect the light illustrating lock-in pixel 1000 (e.g., infrared light pulses generated by a modulated light source on a controller) and direct the collected light to photodiode 1010. For example, in the example shown in FIG. 10B, the optical components may include any combinations of a micro-lens 1090 for collecting and focusing the light illuminating lock-in pixel 1000, a filter layer 1080 that may allow light in a certain wavelength range to pass through, and an antireflection stack 1070 that may include multiple dielectric material layers for refractive index matching and reflection reduction at the surface of p-substrate 1016. The dielectric material layers in antireflection stack 1070 may include, for example, $SiO_2$ layers and SiN layers. Micro-lens 1090 may include, for example, $SiO_2$, SiN, or an organic material.

As described above with respect to FIGS. 7A and 7B, the charge signal generated by photodiode 1010 may be alternately sampled through transfer gate 1020-1 and transfer gate 1020-2 and stored in storage nodes 1030-1 and 1030-2 respectively to generate two voltage signals that may correspond to the maximum and the minimum amplitudes of the light signal to be detected or may correspond to the demodulated in-phase baseband signal I and quadrature-phase baseband signal Q described above with respect to FIG. 7B. The two voltage signals may be read out through source follower 1050-1 and source follower 1050-2, respectively, and may be filtered, amplified, or otherwise conditioned and used to determine the amplitude and/or phase of the detected signal. For example, a difference between the two voltage signals may be calculated to determine the amplitude of the detected signal. In some embodiments, the phase of the detected signal may be determined as described above and used to determine the distance between the controller and the image sensor on, for example, a console or a head-mounted device.

Figure 11:
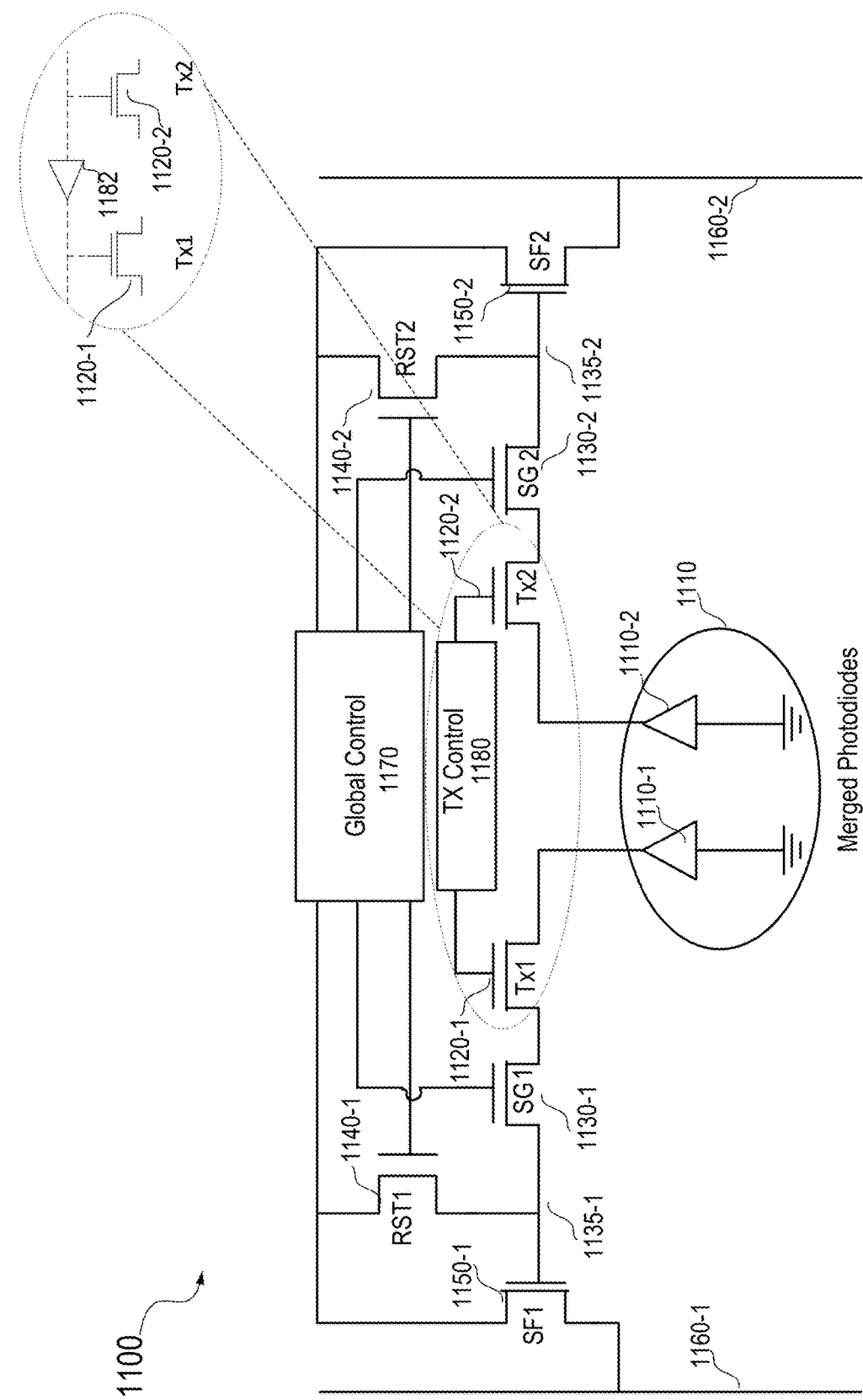
FIG. 11 illustrates the schematic of an example of a lock-in pixel in an image sensor according to certain embodiments.

FIG. 11 illustrates the schematic of an example of a lock-in pixel 1100 in an image sensor (e.g., image sensor 400 or 900) according to certain embodiments. Lock-in pixel 1100 may include two pixel elements, such as two 5T active pixels, arranged in a symmetrical manner such that photodiodes 1110-1 and 1110-2 of the two 5T pixels are adjacent to each other or are physically merged into one larger photodiode 1110. A first 5T pixel of lock-in pixel 1100 may include photodiode 1110-1, a transfer gate 1120-1, a storage node 1135-1, a reset gate 1140-1, and a source follower 1150-1, as described above with respect to the 4T pixel of lock-in pixel 1000. Similarly, a second 5T pixel of lock-in pixel 1100 may include photodiode 1110-2, a transfer gate 1120-2, a storage node 1135-2, a reset gate 1140-2, and a source follower 1150-2. In addition, each of the 5T pixel may include a storage gate (SG), such as SG 1130-1 or SG 1130-2. In some embodiments, SG 1130-1 may be between storage node 1135-1 and source follower 1150-1, and SG 1130-2 may be between storage node 1135-2 and source follower 1150-2. The operations and functions of the components of the first and second 5T pixels may be similar to the operations and functions of the components of pixels described above with respect to, for example, FIGS. 5B, 6, and 9B. Storage gates 1130-1 and 1130-2 can be used as a global shutter switch. Storage gates 1130-1 and 1130-2, reset gates 1140-1 and 1140-2, and source followers 1150-1 and 1150-2 may be controlled by a global control circuit 1170. Transfer gates 1120-1 and 1120-2 may be controlled by a transfer gate control circuit 1180.

Transfer gate 1120-1 and transfer gate 1120-2 may each be switched on or off by a respective control signal. The two control signals for transfer gate 1120-1 and transfer gate 1120-2 may have the same frequency but different phases with respect to the reference signal used to modulate the light source to generated the pulsed light signal. For example, transfer gate control circuit 1180 may include a gate 1182 between the two control signals for transfer gate 1120-1 and transfer gate 1120-2 as shown in FIG. 11. Gate 1182 may be an invertor or another gate that may add a delay to a signal such that transfer gate 1120-1 and transfer gate 1120-2 may be turned on at different time instants to sample the charge signals generated by photodiode 1110-1 and photodiode 1110-2 at different time. In this way, transfer gate 1120-1 and transfer gate 1120-2 may down-convert or demodulate the charge signals generated by photodiode 1110-1 and photodiode 1110-2, where the control signal may be used as the reference signal (or local carrier) for the mixing or demodulation. The difference between the output signals of the two 4T active pixels may be calculated to remove the DC noise and determine the amplitude of the pulses light signal to be detected.

The lock-in pixels disclosed herein can be used in other image sensors, such as image sensors for depth sensing using structured light or stereo images or image sensors for eye-tracking in an augmented reality system, where the noise from the working environment may be large compared with the signal to be detected or measured. The lock-in pixels may be combined with other active pixels (e.g., 3T or 4T active pixels) to form hybrid, dual-band and/or dual-function image sensors that may simultaneously perform different imaging functions, for example, in different wavelength bands.

Figure 12:
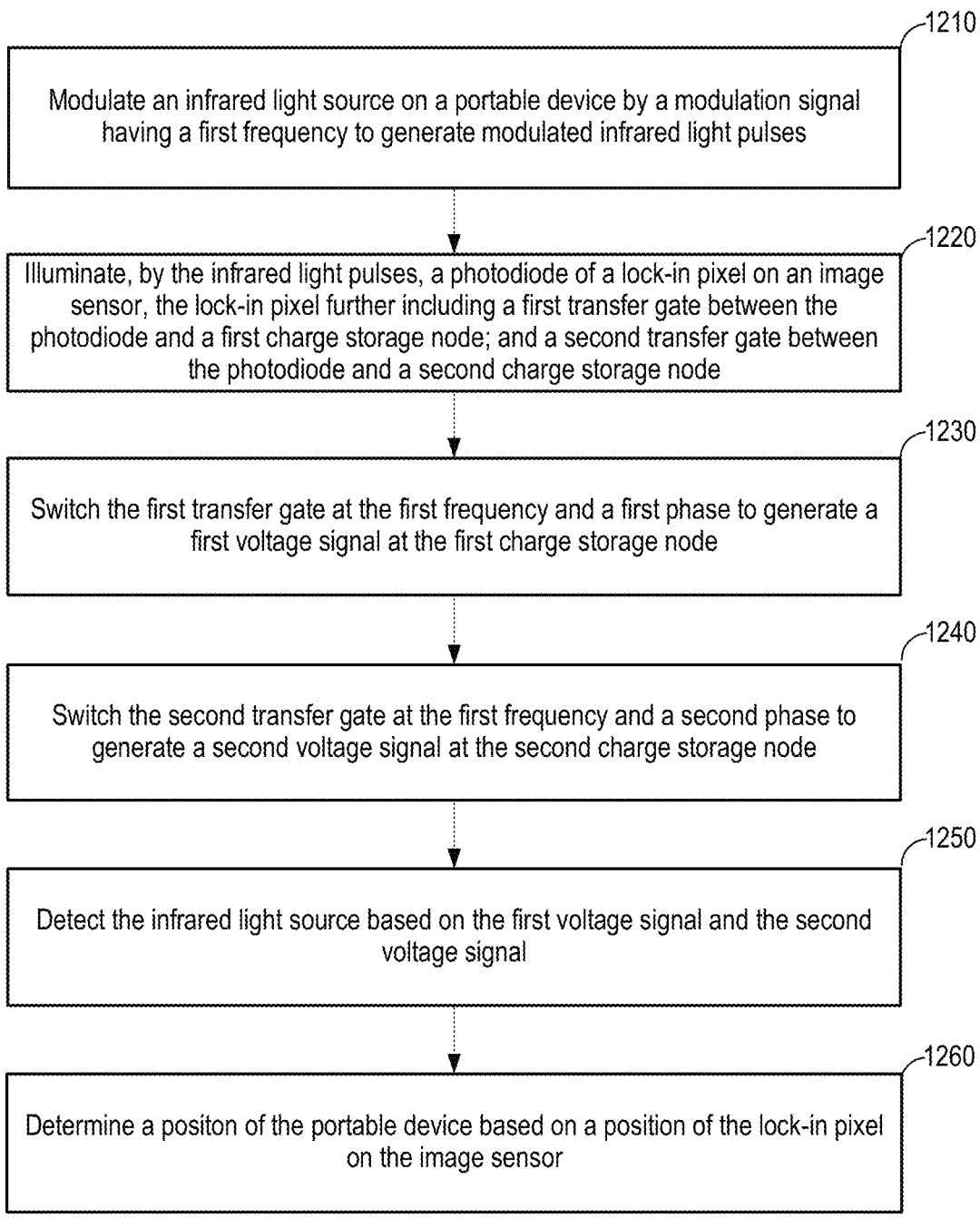
FIG. 12 is a flow chart illustrating an example of a method for controller tracking and visible light imaging using a same image sensor in an augmented reality system according to certain embodiments.

FIG. 12 is a simplified flow chart 1200 illustrating an example of a method for controller tracking and visible light imaging using a same image sensor in an augmented reality system according to certain embodiments. The processing presented in FIG. 12 and described below is intended to be illustrative and non-limiting. Although FIG. 12 depicts the various operations occurring in a particular sequence or order, this is not intended to be limiting. In certain alternative embodiments, the operations may be performed in some different order or some operations may also be performed in parallel. In some embodiments, the processing described in FIG. 12 may be performed by, for example, artificial reality system 100 and various image sensors described above (e.g., image sensor 400 or 900).

At block 1210, an infrared light source on a portable device may be modulated by a modulation signal having a first frequency such that the infrared light source may generate modulated infrared light pulses. The portable device may include, for example, a controller for an artificial reality system, such as a virtual reality system. The first frequency may be, for example, between about 50 MHz and about 150 MHz. The modulation signal may include, for example, a sinusoidal signal, a rectangular wave signal, a triangle wave signal, a square wave signal, or the like, generated by a source generator on the portable device.

At block 1220, the infrared light pulses may illuminate a photodiode of a lock-in pixel on an image sensor. The image sensor may be located on a head-mounted device or a console of the artificial reality system, and may include a two-dimensional array of active pixels for capturing, for example, visible light images. Each active pixel may include, for example, a 3T active pixel, a 4T active pixel, or a 5T global shutter active pixel. The photodiode may include, for example, a pinned photodiode that may be sensitive to both visible light and infrared light. The lock-in pixel may also include a first transfer gate between the photodiode and a first charge storage node (e.g., a floating diffusion node); and may also include a second transfer gate between the photodiode and a second charge storage node. The lock-in pixel may be formed by merging the photodiodes of two adjacent active pixels. The lock-in pixel may further include reset gates connected to the storage nodes and configured to reset the storage nodes to a certain voltage level. The image sensor may include two or more lock-in pixels distributed on two or more regions of the image sensor. In some embodiments, a micro-lens may be formed on each lock-in pixel.

At block 1230, the first transfer gate may be switched at the first frequency and a first phase to capture the modulated infrared light pulses from the infrared light source at the first frequency and generate a first voltage signal at the first charge storage node. The first voltage signal may include a demodulated signal from the infrared light pulses.

At block 1240, the second transfer gate may be switched at the first frequency and a second phase to capture the modulated infrared light pulses from the infrared light source and generate a second voltage signal at the second charge storage node. The second voltage signal may also include a demodulated signal from the infrared light pulses.

At block 1250, a processor may detect the infrared light source based on the first voltage signal and the second voltage signal. For example, the processor may detect the infrared light source based on determining that a difference between an amplitude of the first voltage signal and an amplitude of the second voltage signal is greater than a threshold value.

At block 1260, the processor may determine a position of the portable device based on a position of the lock-in pixel on the image sensor. In some embodiments, the image sensor may also capturing a visible light image of a field of view of the image sensor using the two-dimensional array of active pixels. In some embodiments, the processor may determine a phase of the infrared light pulses illuminating the photodiode based on the first voltage signal and the second voltage signal, and determine a distance between the image sensor and the infrared light source.

Figure 13:
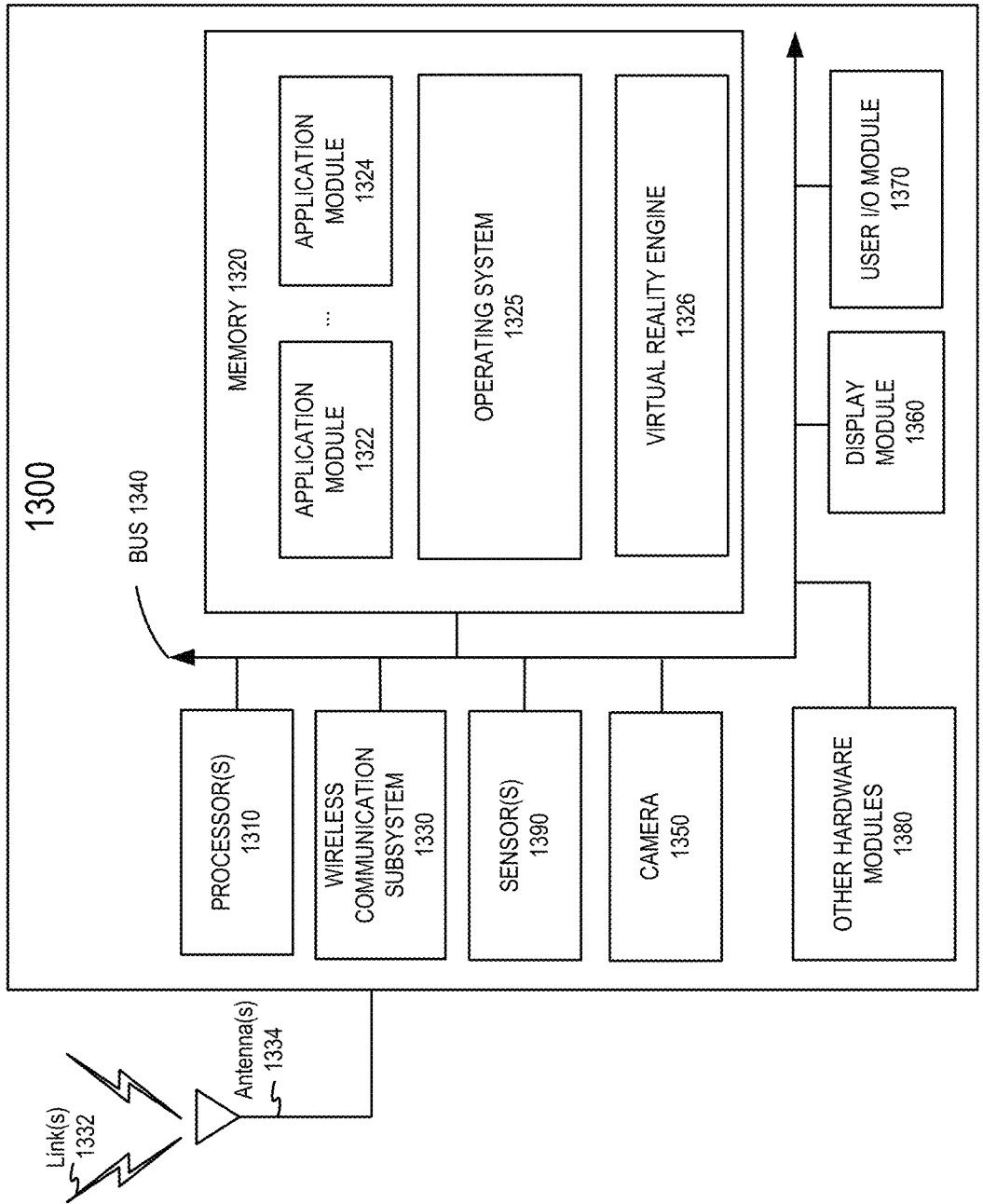
FIG. 13 is a simplified block diagram of an electronic system of an example of a near-eye display according to certain embodiments.

FIG. 13 is a simplified block diagram of an example electronic system 1300 of an example near-eye display (e.g., HMD device) for implementing some of the examples disclosed herein. Electronic system 1300 may be used as the electronic system of an HMD device or other near-eye displays described above. In this example, electronic system 1300 may include one or more processor(s) 1310 and a memory 1320. Processor(s) 1310 may be configured to execute instructions for performing operations at a number of components, and can be, for example, a general-purpose processor or microprocessor suitable for implementation within a portable electronic device. Processor(s) 1310 may be communicatively coupled with a plurality of components within electronic system 1300. To realize this communicative coupling, processor(s) 1310 may communicate with the other illustrated components across a bus 1340. Bus 1340 may be any subsystem adapted to transfer data within electronic system 1300. Bus 1340 may include a plurality of computer buses and additional circuitry to transfer data.

Memory 1320 may be coupled to processor(s) 1310. In some embodiments, memory 1320 may offer both short-term and long-term storage and may be divided into several units. Memory 1320 may be volatile, such as static random access memory (SRAM) and/or dynamic random access memory (DRAM) and/or non-volatile, such as read-only memory (ROM), flash memory, and the like. Furthermore, memory 1320 may include removable storage devices, such as secure digital (SD) cards. Memory 1320 may provide storage of computer-readable instructions, data structures, program modules, and other data for electronic system 1300. In some embodiments, memory 1320 may be distributed into different hardware modules. A set of instructions and/or code might be stored on memory 1320. The instructions might take the form of executable code that may be executable by electronic system 1300, and/or might take the form of source and/or installable code, which, upon compilation and/or installation on electronic system 1300 (e.g., using any of a variety of generally available compilers, installation programs, compression/decompression utilities, etc.), may take the form of executable code.

In some embodiments, memory 1320 may store a plurality of application modules 1322 through 1324, which may include any number of applications. Examples of applications may include gaming applications, conferencing applications, video playback applications, or other suitable applications. The applications may include a depth sensing function or eye tracking function. Application modules 1322-1324 may include particular instructions to be executed by processor(s) 1310. In some embodiments, certain applications or parts of application modules 1322-1324 may be executable by other hardware modules 1380. In certain embodiments, memory 1320 may additionally include secure memory, which may include additional security controls to prevent copying or other unauthorized access to secure information.

In some embodiments, memory 1320 may include an operating system 1325 loaded therein. Operating system 1325 may be operable to initiate the execution of the instructions provided by application modules 1322-1324 and/or manage other hardware modules 1380 as well as interfaces with a wireless communication subsystem 1330 which may include one or more wireless transceivers. Operating system 1325 may be adapted to perform other operations across the components of electronic system 1300 including threading, resource management, data storage control and other similar functionality.

Wireless communication subsystem 1330 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 1300 may include one or more antennas 1334 for wireless communication as part of wireless communication subsystem 1330 or as a separate component coupled to any portion of the system. Depending on desired functionality, wireless communication subsystem 1330 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 1330 may permit data to be exchanged with a network, other computer systems, and/or any other devices described herein. Wireless communication subsystem 1330 may include a means for transmitting or receiving data, such as identifiers of HMD devices, position data, a geographic map, a heat map, photos, or videos, using antenna(s) 1334 and wireless link(s) 1332. Wireless communication subsystem 1330, processor(s) 1310, and memory 1320 may together comprise at least a part of one or more of a means for performing some functions disclosed herein.

Embodiments of electronic system 1300 may also include one or more sensors 1390. Sensor(s) 1390 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 1390 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 1300 may include a display module 1360. Display module 1360 may be a near-eye display, and may graphically present information, such as images, videos, and various instructions, from electronic system 1300 to a user. Such information may be derived from one or more application modules 1322-1324, virtual reality engine 1326, one or more other hardware modules 1380, a combination thereof, or any other suitable means for resolving graphical content for the user (e.g., by operating system 1325). Display module 1360 may use LCD technology, LED technology (including, for example, OLED, ILED, μ-LED, AMO-LED, TOLED, etc.), light emitting polymer display (LPD) technology, or some other display technology.

Electronic system 1300 may include a user input/output module 1370. User input/output module 1370 may allow a user to send action requests to electronic system 1300. An action request may be a request to perform a particular action. For example, an action request may be to start or end an application or to perform a particular action within the application. User input/output module 1370 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1300. In some embodiments, user input/output module 1370 may provide haptic feedback to the user in accordance with instructions received from electronic system 1300. For example, the haptic feedback may be provided when an action request is received or has been performed.

Electronic system 1300 may include a camera 1350 that may be used to take photos or videos of a user, for example, for tracking the user's eye position. Camera 1350 may also be used to take photos or videos of the environment, for example, for VR, AR, or MR applications. Camera 1350 may include, for example, a complementary metal-oxide-semiconductor (CMOS) image sensor with a few millions or tens of millions of pixels. In some implementations, camera 1350 may include two or more cameras that may be used to capture 3-D images.

In some embodiments, electronic system 1300 may include a plurality of other hardware modules 1380. Each of other hardware modules 1380 may be a physical module within electronic system 1300. While each of other hardware modules 1380 may be permanently configured as a structure, some of other hardware modules 1380 may be temporarily configured to perform specific functions or temporarily activated. Examples of other hardware modules 1380 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 1380 may be implemented in software.

In some embodiments, memory 1320 of electronic system 1300 may also store a virtual reality engine 1326. Virtual reality engine 1326 may execute applications within electronic system 1300 and receive position information, acceleration information, velocity information, predicted future positions, or any combination thereof of the HMD device from the various sensors. In some embodiments, the information received by virtual reality engine 1326 may be used for producing a signal (e.g., display instructions) to display module 1360. For example, if the received information indicates that the user has looked to the left, virtual reality engine 1326 may generate content for the HMD device that mirrors the user's movement in a virtual environment. Additionally, virtual reality engine 1326 may perform an action within an application in response to an action request received from user input/output module 1370 and provide feedback to the user. The provided feedback may be visual, audible, or haptic feedback. In some implementations, processor(s) 1310 may include one or more GPUs that may execute virtual reality engine 1326.

In various implementations, the above-described hardware and modules may be implemented on a single device or on multiple devices that can communicate with one another using wired or wireless connections. For example, in some implementations, some components or modules, such as GPUs, virtual reality engine 1326, and applications (e.g., tracking application), may be implemented on a console separate from the head-mounted display device. In some implementations, one console may be connected to or support more than one HMD.

In alternative configurations, different and/or additional components may be included in electronic system 1300. Similarly, functionality of one or more of the components can be distributed among the components in a manner different from the manner described above. For example, in some embodiments, electronic system 1300 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. An image sensor comprising:
a two-dimensional array of active pixels, each active pixel in the two-dimensional array of active pixels including a respective photodiode; and
a plurality of lock-in pixels dispersed at two or more regions of the two-dimensional array, each of the plurality of lock-in pixels formed by two adjacent active pixels of the two-dimensional array of active pixels, wherein the photodiodes of the two active pixels are connected to form a common photodiode, and wherein each active pixel of the two adjacent active pixels of the lock-in pixel includes:
a respective charge storage node; and
a respective switch configured to receive a respective control signal to selectively connect the charge storage node to the common photodiode.

2. The image sensor of claim 1, wherein the common photodiode is sensitive to both visible light and infrared light.

3. The image sensor of claim 1, wherein the common photodiode includes a pinned photodiode.

4. The image sensor of claim 1, wherein the switch includes a metal-oxide-semiconductor field-effect transistor.

5. The image sensor of claim 1, wherein each active pixel of the two adjacent active pixels of the lock-in pixel further includes a respective reset gate connected to the charge storage node and configured to reset the charge storage node to a voltage level.

6. The image sensor of claim 1, wherein the charge storage node includes a floating diffusion node.

7. The image sensor of claim 1, wherein each active pixel of the two-dimensional array of active pixels further includes:
a storage node; and
a transfer gate between the respective photodiode and the storage node of the active pixel.

8. The image sensor of claim 1, wherein each active pixel of the two-dimensional array of active pixels includes a five-transistor global shutter active pixel, a four-transistor active pixel, or a three-transistor active pixel.

9. The image sensor of claim 1, further comprising a micro-lens on each respective lock-in pixel in the plurality of lock-in pixels.

10. A system comprising:
an image sensor including:
a two-dimensional array of active pixels, each of the two-dimensional array of active pixels including a respective photodiode that is sensitive to visible light; and
a plurality of lock-in pixels at two or more regions of the two-dimensional array, each lock-in pixel of the plurality of lock-in pixels including two pixel elements, wherein:
the two pixel elements share a common photodiode that is sensitive to infrared light; and
each of the two pixel elements includes a switch connected to the common photodiode; and
a portable device in a field of view of the image sensor, the portable device including a light source that is configured to generate infrared light pulses at a first frequency,
wherein the switch in each of the two pixel elements in the lock-in pixel is configurable to switch at the first frequency and with a different respective phase delay.

11. The system of claim 10, wherein a difference between the respective phase delays for switching the two pixel elements in the lock-in pixel is 90°.

12. The system of claim 10, wherein the common photodiode is sensitive to the visible light.

13. The system of claim 10, wherein the common photodiode includes a pinned photodiode.

14. The system of claim 10, wherein the switch includes a metal-oxide-semiconductor field-effect transistor.

15. The system of claim 10, wherein each active pixel of the two-dimensional array of active pixels includes a five-transistor global shutter active pixel, a four-transistor active pixel, or a three-transistor active pixel.

16. The system of claim 10, wherein:
the two-dimensional array of active pixels is configured to capture images in the visible light;
the plurality of lock-in pixels is configured to capture the infrared light pulses from the light source; and
the system includes a processor configured to determine a location of the portable device based on the infrared light pulses captured by the plurality of lock-in pixels.

17. The system of claim 10, wherein:
the system includes an artificial reality system;
the image sensor is in a head-mounted device or a console of the artificial reality system; and
the portable device includes a controller of the artificial reality system.

18. A method comprising:
modulating an infrared light source on a portable device by a modulation signal having a first frequency;
generating, by the infrared light source, infrared light pulses;
illuminating, by the infrared light pulses, a photodiode of a lock-in pixel on an image sensor, the lock-in pixel further including:
a first transfer gate between the photodiode and a first charge storage node; and
a second transfer gate between the photodiode and a second charge storage node;
switching the first transfer gate at the first frequency and a first phase to generate a first voltage signal at the first charge storage node;

switching the second transfer gate at the first frequency and a second phase to generate a second voltage signal at the second charge storage node;

determining that a difference between an amplitude of the first voltage signal and an amplitude of the second voltage signal is greater than a threshold value; and determining a position of the portable device based on a position of the lock-in pixel on the image sensor.

19. The method claim 18, further comprising:

capturing, by a two-dimensional array of active pixels of the image sensor, a visible light image of a field of view of the image sensor.

20. The method claim 18, further comprising:

determining a phase of the infrared light pulses illuminating the photodiode based on the first voltage signal and the second voltage signal; and determining a distance between the image sensor and the infrared light source.

\* \* \* \* \*